(12) United States Patent
Nishimura et al.

(10) Patent No.: US 7,622,392 B2
(45) Date of Patent: Nov. 24, 2009

(54) METHOD OF PROCESSING SUBSTRATE, METHOD OF MANUFACTURING SOLID-STATE IMAGING DEVICE, METHOD OF MANUFACTURING THIN FILM DEVICE, AND PROGRAMS FOR IMPLEMENTING THE METHODS

(75) Inventors: Eiichi Nishimura, Nirasaki (JP); Kenya Iwasaki, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 380 days.

(21) Appl. No.: 11/357,168

(22) Filed: Feb. 21, 2006

(65) Prior Publication Data

US 2006/0191865 A1 Aug. 31, 2006

Related U.S. Application Data

(60) Provisional application No. 60/658,158, filed on Mar. 4, 2005.

(30) Foreign Application Priority Data

Feb. 18, 2005 (JP) .............. 2005-042579
Sep. 26, 2005 (JP) .............. 2005-278842

(51) Int. Cl.
  H01L 21/302 (2006.01)
(52) U.S. Cl. ........................ 438/706; 216/59
(58) Field of Classification Search ........ 438/689, 438/706; 216/58, 59
  See application file for complete search history.

(56) References Cited

U.S. PATENT DOCUMENTS

| 5,591,486 | A | * | 1/1997 | Okano et al. | ............ 427/255.28 |
| 5,623,243 | A | * | 4/1997 | Watanabe et al. | ........... 257/309 |
| 5,776,557 | A | * | 7/1998 | Okano et al. | ................. 427/579 |
| 6,660,598 | B2 | | 12/2003 | Hanafi et al. | |
| 2004/0182417 | A1 | | 9/2004 | Hamelin et al. | |
| 2004/0184792 | A1 | | 9/2004 | Hamelin et al. | |
| 2004/0185583 | A1 | * | 9/2004 | Tomoyasu et al. | .............. 438/8 |
| 2004/0185670 | A1 | | 9/2004 | Hamelin et al. | |
| 2004/0241981 | A1 | * | 12/2004 | Doris et al. | .................. 438/637 |
| 2006/0096951 | A1 | * | 5/2006 | Natzle et al. | ................... 216/58 |
| 2007/0194235 | A1 | * | 8/2007 | Kimba et al. | ................ 250/310 |

FOREIGN PATENT DOCUMENTS

| JP | 2003-75625 | 3/2003 |
| JP | 2004-311557 | 11/2004 |

* cited by examiner

*Primary Examiner*—Kin-Chan Chen
(74) *Attorney, Agent, or Firm*—Oblon, Spivak, McClelland, Maier & Neustadt, L.L.P.

(57) ABSTRACT

A method of processing a substrate that enables the amount removed of an insulating film to be controlled precisely, without damaging an electronic device. An insulating film on a substrate of a solid-state imaging device is exposed to an atmosphere of a mixed gas containing ammonia and hydrogen fluoride under a predetermined pressure. The insulating film that has been exposed to the atmosphere of the mixed gas is heated to a predetermined temperature.

12 Claims, 9 Drawing Sheets

METHOD OF PROCESSING SUBSTRATE, METHOD OF MANUFACTURING SOLID-STATE IMAGING DEVICE, METHOD OF MANUFACTURING THIN FILM DEVICE, AND PROGRAMS FOR IMPLEMENTING THE METHODS

BACKGROUND OF THE INVENTION

1. Field of the Invention

The present invention relates to a method of processing a substrate, a method of manufacturing a solid-state imaging device, a method of manufacturing a thin film device, and programs for implementing the methods, and more particularly to a method of processing a substrate in which an insulating film is polished by chemical mechanical polishing.

2. Description of the Related Art

A color resist method is particularly widely used as a method of manufacturing color filters in electronic devices, for example solid-state imaging devices such as CCD sensors.

In the formation of the color filters, for example in the case that green, red, and blue color filters are formed in this order, the subsequently formed red and blue color filters are affected by the previously formed color filter so that a gradient arises in the film thickness. It is thus difficult to form the color filters to a desired film thickness, i.e. there has been a lack of film thickness controllability. Moreover, variation may arise in the color filter film thickness within a single linear sensor or between multiply demarcated linear sensors, and for solid-state imaging devices this has been a cause of the uniformity of the color filter film thickness on a macroscopic scale becoming poor, and noise and sensitivity irregularity arising, bring about a marked degradation in the line sensor characteristics.

To solve the above problem, hitherto there has been disclosed a color filter manufacturing method in which the film thickness of second and third color filters giving second and third colors is made to be not less than 1.3 times the film thickness of a first color filter giving a first color, whereby no gradient arises in the film thickness of the second and third color filters within an effective pixel, and hence even there is overlap with the first color filter at a peripheral edge portion of each pixel, the occurrence of a difference in film thickness between the portion where there is this overlap and a central portion of the pixel can be suppressed (see, for example, Japanese Laid-open Patent Publication (Kokai) No. 2004-311557).

However, in recent years, for solid-state imaging devices, the pixel size has been reduced as the number of pixels has been increased, and hence art for making the color filter array finer has become essential. Moreover, as the pixel size has been reduced, making the color filters be thin films has also become essential for increasing the light collecting ability of a solid-state imaging device.

With the conventional color filter manufacturing method described above, the color filter array segmentation is carried out assuming a line width of 10 µm. Carrying out the color filter array segmentation to a line width of, for example, not more than 1 µm is thus structurally difficult, and hence increasing the solid-state imaging device fineness has been difficult.

With the color resist method, it has been known from hitherto that to make the color filters be thin films, it is effective to make the percentage content of the colorant relative to the photosensitive resin composition in a colorant-containing photosensitive resin composition that is coated on as high as possible.

However, if the percentage content of a dye as the colorant is made to be close to 50%, then although a desired pattern shape can be obtained through exposure and development, thermal curing of the resin composition becomes difficult. The color filters must be resistant to a solvent contained in each resin composition, and in the conventional manufacturing method, each of the color filters is given such solvent resistance by thermally curing the corresponding resin composition. However, if thermal curing of the resin composition is not carried out, then the solvent resistance of the resulting color filter will be poor, and hence it will become impossible to coat on a resin composition for forming a color filter of another color in a subsequent step. Moreover, to give sufficient solvent resistance, if the thermal curing is carried out at a higher temperature (e.g. not less than 200° C.), the color filters may undergo reflow, or the dye may be chemically changed by the heat, resulting in the color filters no longer exhibiting their original spectral characteristics.

To solve the above problem, there has been disclosed a color filter manufacturing method in which a resin composition is coated on to form color filters, and then a protective film that is an insulating film such as a silicon oxide ($SiO_2$) film or the like is formed on each of the color filters (see, for example, Japanese Laid-open Patent Publication (Kokai) No. 2003-75625). As a result, even if the resin composition coating film is not thermally cured through high-temperature heat treatment, the solvent resistance of the color filters can be made high through the presence of the protective film, and moreover because high-temperature heat treatment is not carried out, the percentage content of a colorant in the color filters can be made high, and hence the color filters can be made thin.

However, in the above color filter manufacturing method, although the color filters can be made thin, a low-temperature plasma CVD step is required to form an approximately 50 nm-thick $SiO_2$ layer as the protective film on the color filters, and hence there has been a problem that the manufacturing time (TAT) is increased.

Moreover, in the conventional color filter manufacturing method, photodecomposition (bleaching) of an unwanted photosensitizer or the like is carried out by irradiating the resin composition that has been coated on with ultraviolet radiation, and then the resin composition is thermally cured through heat treatment. However, controlling the percentage shrinkage of the resin composition due to the thermal curing is difficult, and hence an error in the color filter film thickness arises each time the heat treatment is carried out. The error in the color filter film thickness causes optical axis misalignment in the solid-state imaging device, and thus causes color irregularity or image irregularity to arise.

Moreover, in some conventional solid-state imaging devices, microlenses are provided via a protective film on color filters formed on a flattening film which is an insulating film. In the case that the distance from each light-receiving portion (photoelectric transducer) to the corresponding microlens is great, i.e. the case that the layers between the photoelectric transducer and the microlens are thick, diagonally incident light is blocked by protrusions formed by electrodes and so on, bringing about a decrease in the light collecting ability of the solid-state imaging device. It is thus required to make the layers between the photoelectric transducers and the microlenses thin. Meanwhile, there are demands to improve the image quality with regard to screen hues, and accompanying this it is necessary to further improve the quality with regard to the transmitted color spectral characteristics of the color filters. It is thus necessary to strive to improve the quality of the hues, which can be done by making the color filters thicker. However, making the color filters thicker goes against the requirement to make the color filters be thin films described above.

Furthermore, due to the fineness of solid-state imaging devices being increased, when forming a solid-state imaging device, there have come to be strong demands in a step of forming upper layer elements such as the color filters and microlenses on the precision of alignment of the upper layer elements to base elements. This alignment of the upper layer elements to the base elements is carried out by detecting via the flattening film reflected/diffracted laser light from alignment marks formed on the base elements. However, when detecting the position of the image formed of such an alignment mark via a thick flattening film or protective film, much optical shifting is prone to taking place. To improve the precision of the alignment between the base elements and the upper layer elements, there are thus again demands to make the flattening film and protective film be thin.

To achieve the above, one can envisage making the flattening film and protective film thin, thus reducing the thickness between the photoelectric transducers and the microlenses. As a method of making the flattening film or protective film thin, one can envisage a method in which the flattening film or protective film is formed by etch back.

However, in the case of carrying out etch back, with an etching method using plasma, the etched surface and the electronic device are damaged, and a difference in charge between light-sensitive portions and transfer portions of the solid-state imaging device is brought about, causing an increase in the dark current output. Moreover, if wet etching is used, then controlling the amount removed of the flattening film or protective film is difficult, and hence there has been a problem that the desired film thickness cannot be obtained. In this way, with a conventional substrate processing method, it has been difficult to form a flattening film or protective film of a desired film thickness without damaging the electronic device.

SUMMARY OF THE INVENTION

It is an object of the present invention to provide a method of processing a substrate, a method of manufacturing a solid-state imaging device, a method of manufacturing a thin film device, and programs for implementing the methods, that enable the amount removed of an insulating film to be controlled precisely, without damaging an electronic device.

To attain the above object, in a first aspect of the present invention, there is provided a method of manufacturing a solid-state imaging device, the method comprising an insulating film exposure step of exposing an insulating film on a substrate of the solid-state imaging device to an atmosphere of a mixed gas containing ammonia and hydrogen fluoride under a predetermined pressure, and an insulating film heating step of heating to a predetermined temperature the insulating film that has been exposed to the atmosphere of the mixed gas.

According to the above method, the insulating film on the substrate of the solid-state imaging device is exposed to an atmosphere of a mixed gas containing ammonia and hydrogen fluoride under a predetermined pressure, and then the insulating film that has been exposed to the atmosphere of the mixed gas is heated to a predetermined temperature. Upon the insulating film being exposed to the atmosphere of the mixed gas containing ammonia and hydrogen fluoride under the predetermined pressure, a product based on the insulating film and the mixed gas is produced, and then upon the insulating film that has been exposed to the atmosphere of the mixed gas being heated to the predetermined temperature, the above product is heated and thus vaporized. Through the product being vaporized, an upper layer of the insulating film can be removed. At this time, the amount produced of the product, and hence the amount removed of the upper layer of the insulating film (film thickness), can be controlled precisely through parameters of the mixed gas. Moreover, elements on the substrate of the solid-state imaging device are not damaged by the exposure to the mixed gas or the heating. Control of the amount removed of the insulating film can thus be carried out precisely, and hence the insulating film can be made thin, without damaging the solid-state imaging device manufactured from the substrate.

Preferably, in the insulating film exposure step, the substrate is subjected to plasma-less etching.

According to the above method, the substrate is subjected to plasma-less etching. As a result, charge is not accumulated on a gate electrode in the solid-state imaging device manufactured from the substrate, and hence degradation or destruction of a gate oxide film can be prevented. Moreover, the solid-state imaging device is not irradiated with energetic particles, and hence damage of the solid-state imaging device due to being struck by such energetic particles (i.e. crystal defects) can be prevented from occurring. Furthermore, unanticipated chemical reactions caused by plasma do not occur, and hence generation of impurities can be prevented, whereby contamination of the processing chambers in which the substrate is processed can be prevented.

Also, preferably, in the insulating film exposure step, the substrate is subjected to dry cleaning.

According to the above method, changes in properties of the substrate surface can be suppressed, and hence a decrease in wiring reliability can be reliably prevented.

Preferably, the method further comprises a product production condition deciding step of measuring a shape of the insulating film, and deciding at least one of a volumetric flow rate ratio of the hydrogen fluoride to the ammonia in the mixed gas and the predetermined pressure in accordance with the measured shape.

According to the above method, the shape of the insulating film is measured, and at least one of the volumetric flow rate ratio of the hydrogen fluoride to the ammonia in the mixed gas and the predetermined pressure is decided in accordance with the measured shape. As a result, the amount (film thickness) removed of the upper layer of the insulating film can be controlled more precisely, and the efficiency of the processing to make the insulating film thin can be improved.

Preferably, a volumetric flow rate ratio of the hydrogen fluoride to the ammonia in the mixed gas is in a range of 1 to ½, and the predetermined pressure is in a range of $6.7 \times 10^{-2}$ to 4.0 Pa.

According to the above method, the volumetric flow rate ratio of the hydrogen fluoride to the ammonia in the mixed gas is in a range of 1 to ½, and the predetermined pressure is in a range of $6.7 \times 10^{-2}$ to 4.0 Pa. As a result, production of the product can be promoted, and hence the insulating film upper layer removal (making the insulating film thin) can be carried out reliably.

Preferably, the predetermined temperature is in a range of 80 to 200° C.

According to the above method, the predetermined temperature is in a range of 80 to 200° C. As a result, vaporization of the product can be promoted, and hence the insulating film upper layer removal (making the insulating film thin) can be carried out reliably.

To attain the above object, in a second aspect of the present invention, there is provided a method of manufacturing a solid-state imaging device, the method comprising a film thickness deciding step of deciding a desired film thickness of an insulating film on a substrate of the solid-state imaging device, a pre-processing shape measuring step of measuring a shape of the insulating film, a processing condition deciding step of deciding a first processing condition and a second processing condition based on a comparison of the measured shape and the decided film thickness, an insulating film exposure step of exposing the insulating film to an atmosphere of a mixed gas containing ammonia and hydrogen fluoride under a predetermined pressure based on the first processing condition, and an insulating film heating step of heating to a predetermined temperature based on the second processing condition the insulating film that has been exposed to the atmosphere of the mixed gas.

According to the above method, the insulating film on the substrate of the solid-state imaging device is exposed to an atmosphere of a mixed gas containing ammonia and hydrogen fluoride under a predetermined pressure, and then the insulating film that has been exposed to the atmosphere of the mixed gas is heated to a predetermined temperature. Upon the insulating film being exposed to the atmosphere of the mixed gas containing ammonia and hydrogen fluoride under the predetermined pressure, a product based on the insulating film and the mixed gas is produced, and then upon the insulating film that has been exposed to the atmosphere of the mixed gas being heated to the predetermined temperature, the above product is heated and thus vaporized. Through the product being vaporized, an upper layer of the insulating film can be removed. At this time, the amount produced of the product, and hence the amount removed of the upper layer of the insulating film (film thickness), can be controlled precisely through parameters of the mixed gas. Moreover, elements on the substrate of the solid-state imaging device are not damaged by the exposure to the mixed gas or the heating. Control of the amount removed of the insulating film can thus be carried out precisely, and hence the insulating film can be made thin, without damaging the solid-state imaging device manufactured from the substrate.

Moreover, the shape of the insulating film is measured, a first processing condition and a second processing condition are decided based on a comparison of the measured shape and a decided desired film thickness, and then the insulating film is exposed to the atmosphere of the mixed gas containing ammonia and hydrogen fluoride under the predetermined pressure based on the first processing condition, and the insulating film that has been exposed to the atmosphere of the mixed gas is heated to the predetermined temperature based on the second processing condition. As a result, the amount removed of the insulating film can be controlled yet more precisely, and hence the insulating film can be made yet thinner. Moreover, the efficiency of the manufacture of the solid-state imaging device can be improved.

Preferably, the method further comprises a post-processing shape measuring step of measuring a shape of the insulating film after the insulating film heating step, and a processing condition changing step of changing the first processing condition and the second processing condition based on a comparison of the shape measured in the post-processing shape measuring step and the decided film thickness.

According to the above method, the shape of the insulating film is measured after the insulating film has been exposed to the atmosphere of the mixed gas and then heated to the predetermined temperature, and then the first processing condition and the second processing condition are changed based on a comparison of the measured shape and the decided desired film thickness. As a result, the amount removed of the insulating film can be controlled yet more precisely, and hence the insulating film can be made yet thinner.

More preferably, the first processing condition comprises at least one of a volumetric flow rate ratio of the hydrogen fluoride to the ammonia in the mixed gas, and the predetermined pressure, and the second processing condition comprises the predetermined temperature.

According to the above method, the first processing condition comprises at least one of the volumetric flow rate ratio of the hydrogen fluoride to the ammonia in the mixed gas, and the predetermined pressure, and the second processing condition comprises the predetermined temperature. As a result, the effects for the second aspect described above can be achieved reliably.

To attain the above object, in a third aspect of the present invention, there is provided a method of manufacturing a solid-state imaging device having a substrate, a plurality of photoelectric transducers provided in a matrix shape on the substrate, an insulating film formed on the substrate having the plurality of photoelectric transducers provided thereon, signal charge transfer electrodes constructed from switching elements and wiring that are formed adjacent to the photoelectric transducers, interlayer insulating films each formed on a corresponding one of the signal charge transfer electrodes, and light-shielding films made of a metal each formed on a corresponding one of the signal charge transfer electrodes via a corresponding one of the interlayer insulating films, the method comprising a metallic film formation step of forming a metallic film for forming the light-shielding films, a resist patterning step of forming a resist in a predetermined pattern for forming the light-shielding films from the metallic film, a patterning step of patterning by dry etching the metallic film, and the insulating film as far as close to immediately above the photoelectric transducers using the resist, thus forming the light-shielding films and holes, a resist removal step of removing the resist, a silicon nitride film formation step of forming a silicon nitride film in recesses defined by the light-shielding films and the holes, a flattening film formation step of coating on a transparent insulating material having a lower refractive index than the silicon nitride film so as to form a first insulating layer, and flattening the first insulating layer so as to form a flattening film, a color filter formation step of forming color filters on the flattening film, and a protective film formation step of forming a second insulating layer on the color filters, and thinning the second insulating layer so as to form a protective film, wherein the flattening film formation step has an insulating film exposure step of exposing the first insulating layer to an atmosphere of a mixed gas containing ammonia and hydrogen fluoride under a predetermined pressure, and an insulating film heating step of heating to a predetermined temperature the first insulating layer that has been exposed to the atmosphere of the mixed gas, and the protective film formation step has an insulating film exposure step of exposing the second insulating layer to an atmosphere of a mixed gas containing ammonia and hydrogen fluoride under a predetermined pressure, and an insulating film heating step of heating to a predetermined temperature the second insulating layer that has been exposed to the atmosphere of the mixed gas.

According to the above method, the first insulating layer coated on for forming the flattening film on which the color filters are to be formed, and the second insulating layer coated on for forming the protective film on the color filters are each exposed to an atmosphere of a mixed gas containing ammonia and hydrogen fluoride under a predetermined pressure, and then heated to a predetermined temperature. Upon each of the first and second insulating films being exposed to the atmosphere of the mixed gas containing ammonia and hydrogen fluoride under the predetermined pressure, a product based on the first or second insulating film and the mixed gas is produced, and then upon the first or second insulating film that has been exposed to the atmosphere of the mixed gas being heated to the predetermined temperature, the above product is heated and thus vaporized. Through the product being vaporized, an upper layer of each of first and second insulating films can be removed. At this time, the amount produced of the product, and hence the amount removed of the upper layer of each of first and second insulating films (film thickness), can be controlled precisely through parameters of the mixed gas. Moreover, elements of the solid-state imaging device are not damaged by the exposure to the mixed gas or the heating. Control of the amount removed of each insulating film can thus be carried out precisely, and hence each insulating film can be made thin, without damaging the solid-state imaging device.

To attain the above object, in a fourth aspect of the present invention, there is provided a method of manufacturing a solid-state imaging device, the method comprising a light-receiving portion formation step of forming on a substrate a plurality of light-receiving portions that produce signal charges in response to received light, an insulating film formation step of forming an insulating film on the substrate on which the light-receiving portions have been formed, a signal charge transfer portion formation step of forming signal charge transfer portions that transfer signal charges obtained by the light-receiving portions, a light-shielding film formation step of forming conductive light-shielding films on the signal charge transfer portions, and a light-transmitting electrode formation step of forming a light-transmitting electrode comprising an amorphous silicon thin film by chemical vapor deposition on the light-receiving portions via the insulating film, and directly on the light-shielding films, wherein the insulating film formation step has an insulating material coating step of coating an insulating material onto the substrate on which the light-receiving portions have been formed, for forming the insulating film, an insulating material exposure step of exposing the coated on insulating material to an atmosphere of a mixed gas containing ammonia and hydrogen fluoride under a predetermined pressure, and an insulating material heating step of heating to a predetermined temperature the insulating material that has been exposed to the atmosphere of the mixed gas.

According to the above method, after having been coated onto the substrate on which the light-receiving portions have been formed, the insulating material for forming the insulating film on the substrate is exposed to an atmosphere of a mixed gas containing ammonia and hydrogen fluoride under a predetermined pressure, and then the insulating material that has been exposed to the atmosphere of the mixed gas is heated to a predetermined temperature. Upon the insulating material being exposed to the atmosphere of the mixed gas containing ammonia and hydrogen fluoride under the predetermined pressure, a product based on the insulating material and the mixed gas is produced, and then upon the insulating material that has been exposed to the atmosphere of the mixed gas being heated to the predetermined temperature, the above product is heated and thus vaporized. Through the product being vaporized, an upper layer of the insulating material can be removed. At this time, the amount produced of the product, and hence the amount removed of the upper layer of the insulating material (film thickness), can be controlled precisely through parameters of the mixed gas. Moreover, elements of the solid-state imaging device are not damaged by the exposure to the mixed gas or the heating. Control of the amount removed of the insulating film can thus be carried out precisely, and hence the insulating film can be made thin, without damaging the solid-state imaging device.

To attain the above object, in a fifth aspect of the present invention, there is provided a method of manufacturing a CCD thin film device having a substrate, a plurality of chips having an identically shaped pattern formed on the substrate, and an optically transparent insulating thin film at least on a surface, the method comprising a film formation step of forming an insulating film for forming the thin film, a film exposure step of exposing the insulating film to an atmosphere of a mixed gas containing ammonia and hydrogen fluoride under a predetermined pressure, a film heating step of heating to a predetermined temperature the insulating film that has been exposed to the atmosphere of the mixed gas, a film detection step of carrying out detection relating to a predetermined condition on the insulating film after the heating at a preset detection location on each of the chips, and a transfer step of transferring the thin film device to a subsequent manufacturing step once the insulating film satisfies the predetermined condition at all of the detection locations on the chips in the film detection step.

According to the above method, the insulating film that has been formed for forming the thin film of the CCD thin film device is exposed to an atmosphere of a mixed gas containing ammonia and hydrogen fluoride under a predetermined pressure, and then the insulating film that has been exposed to the atmosphere of the mixed gas is heated to a predetermined temperature. Upon the insulating film being exposed to the atmosphere of the mixed gas containing ammonia and hydrogen fluoride under the predetermined pressure, a product based on the insulating film and the mixed gas is produced, and then upon the insulating film that has been exposed to the atmosphere of the mixed gas being heated to the predetermined temperature, the above product is heated and thus vaporized. Through the product being vaporized, an upper layer of the insulating film can be removed. At this time, the amount produced of the product, and hence the amount removed of the upper layer of the insulating film (film thickness), can be controlled precisely through parameters of the mixed gas. Moreover, elements of the CCD thin film device are not damaged by the exposure to the mixed gas or the heating. Control of the amount removed of the insulating film can thus be carried out precisely, and hence the insulating film can be made thin, without damaging the elements of the thin film device. Moreover, detection relating to a predetermined condition is carried out on the insulating film after the heating at a preset detection location on each of the chips, and the thin film device is transferred to a subsequent manufacturing step only once the insulating film satisfies the predetermined condition at all of the detection locations on the chips. As a result, the proportion of non-defective CCDs can be improved.

To attain the above object, in a sixth aspect of the present invention, there is provided a program for causing a computer to execute a method of processing a substrate, the program comprising an insulating film exposure module for exposing an insulating film on a substrate to an atmosphere of a mixed gas containing ammonia and hydrogen fluoride under a predetermined pressure, and an insulating film heating module for heating to a predetermined temperature the insulating film that has been exposed to the atmosphere of the mixed gas.

According to the above program, effects as for the first aspect can be achieved.

To attain the above object, in a seventh aspect of the present invention, there is provided a program for causing a computer to execute a method of manufacturing a solid-state imaging device, the program comprising a film thickness deciding module for deciding a desired film thickness of an insulating film on a substrate of the solid-state imaging device, a pre-processing shape measuring module for measuring a shape of the insulating film, a processing condition deciding module for deciding first processing condition and second processing condition based on a comparison of the measured shape and the decided film thickness, an insulating film exposure module for exposing the insulating film to an atmosphere of a mixed gas containing ammonia and hydrogen fluoride under a predetermined pressure based on the first processing condition, and an insulating film heating module for heating to a predetermined temperature based on the second processing condition the insulating film that has been exposed to the atmosphere of the mixed gas.

According to the above program, effects as for the second aspect can be achieved.

To attain the above object, in an eighth aspect of the present invention, there is provided a program for causing a computer to execute a method of manufacturing a solid-state imaging device having a substrate, a plurality of photoelectric transducers provided in a matrix shape on the substrate, an insulating film formed on the substrate having the plurality of photoelectric transducers provided thereon, signal charge transfer electrodes constructed from switching elements and wiring that are formed adjacent to the photoelectric transducers, interlayer insulating films each formed on a corresponding one of the signal charge transfer electrodes, and light-shielding films made of a metal each formed on a corresponding one of the signal charge transfer electrodes via a corresponding one of the interlayer insulating films, the program comprising a metallic film formation module for forming a metallic film for forming the light-shielding films, a resist patterning module for forming a resist in a predetermined pattern for forming the light-shielding films from the metallic film, a patterning module for patterning by dry etching the metallic film, and the insulating film as far as close to immediately above the photoelectric transducers using the resist, thus forming the light-shielding films and holes, a resist removal module for removing the resist, a silicon nitride film formation module for forming a silicon nitride film in recesses defined by the light-shielding films and the holes, a flattening film formation module for coating on a transparent insulating material having a lower refractive index than the silicon nitride film so as to form a first insulating layer, and flattening the first insulating layer so as to form a flattening film, a color filter formation module for forming color filters on the flattening film, and a protective film formation module for forming a second insulating layer on the color filters, and thinning the second insulating layer so as to form a protective film, wherein the flattening film formation module has an insulating film exposure module for exposing the first insulating layer to an atmosphere of a mixed gas containing ammonia and hydrogen fluoride under a predetermined pressure, and an insulating film heating module for heating to a predetermined temperature the first insulating layer that has been exposed to the atmosphere of the mixed gas, and the protective film formation module has an insulating film exposure module for exposing the second insulating layer to an atmosphere of a mixed gas containing ammonia and hydrogen fluoride under a predetermined pressure, and an insulating film heating module for heating to a predetermined temperature the second insulating layer that has been exposed to the atmosphere of the mixed gas.

According to the above program, effects as for the third aspect can be achieved.

To attain the above object, in a ninth aspect of the present invention, there is provided a program for causing a computer to execute a method of manufacturing a solid-state imaging device, the program comprising a light-receiving portion formation module for forming on a substrate a plurality of light-receiving portions that produce signal charges in response to received light, an insulating film formation module for forming an insulating film on the substrate on which the light-receiving portions have been formed, a signal charge transfer portion formation module for forming signal charge transfer portions that transfer signal charges obtained by the light-receiving portions, a light-shielding film formation module for forming conductive light-shielding films on the signal charge transfer portions, and a light-transmitting electrode formation module for forming a light-transmitting electrode comprising an amorphous silicon thin film by chemical vapor deposition on the light-receiving portions via the insulating film, and directly on the light-shielding films, wherein the insulating film formation module has an insulating material coating module for coating an insulating material onto the substrate on which the light-receiving portions have been formed, for forming the insulating film, an insulating material exposure module for exposing the coated on insulating material to an atmosphere of a mixed gas containing ammonia and hydrogen fluoride under a predetermined pressure, and an insulating material heating module for heating to a predetermined temperature the insulating material that has been exposed to the atmosphere of the mixed gas.

According to the above program, effects as for the fourth aspect can be achieved.

To attain the above object, in a tenth aspect of the present invention, there is provided a program for causing a computer to execute a method of manufacturing a CCD thin film device having a substrate, a plurality of chips having an identically shaped pattern formed on the substrate, and an optically transparent insulating thin film at least on a surface, the program comprising a film formation module for forming an insulating film for forming the thin film, a film exposure module for exposing the insulating film to an atmosphere of a mixed gas containing ammonia and hydrogen fluoride under a predetermined pressure, a film heating module for heating to a predetermined temperature the insulating film that has been exposed to the atmosphere of the mixed gas, a film detection module for carrying out detection relating to a predetermined condition on the insulating film after the heating at a preset detection location on each of the chips, and a transfer module for transferring the thin film device to a subsequent manufacturing step once the insulating film satisfies the predetermined condition at all of the detection locations on the chips in the film detection module.

According to the above program, effects as for the fifth aspect can be achieved.

The above and other objects, features, and advantages of the invention will become more apparent from the following detailed description taken in conjunction with the accompanying drawings.

BRIEF DESCRIPTION OF THE DRAWINGS

FIG. 2A is a sectional view taken along line II-II in FIG. 1; and

FIG. 2B is an enlarged view of a portion A shown in FIG. 2A;

FIG. 6A is a view useful in explaining elements on a wafer W in the CCD sensor; and FIG. 6B is a sectional view of part of the CCD sensor;

DETAILED DESCRIPTION OF THE PREFERRED EMBODIMENTS

The present invention will now be described in detail with reference to the drawings showing preferred embodiments thereof.

First, a method of processing a substrate according to an embodiment of the present invention will be described.

Figure 1:
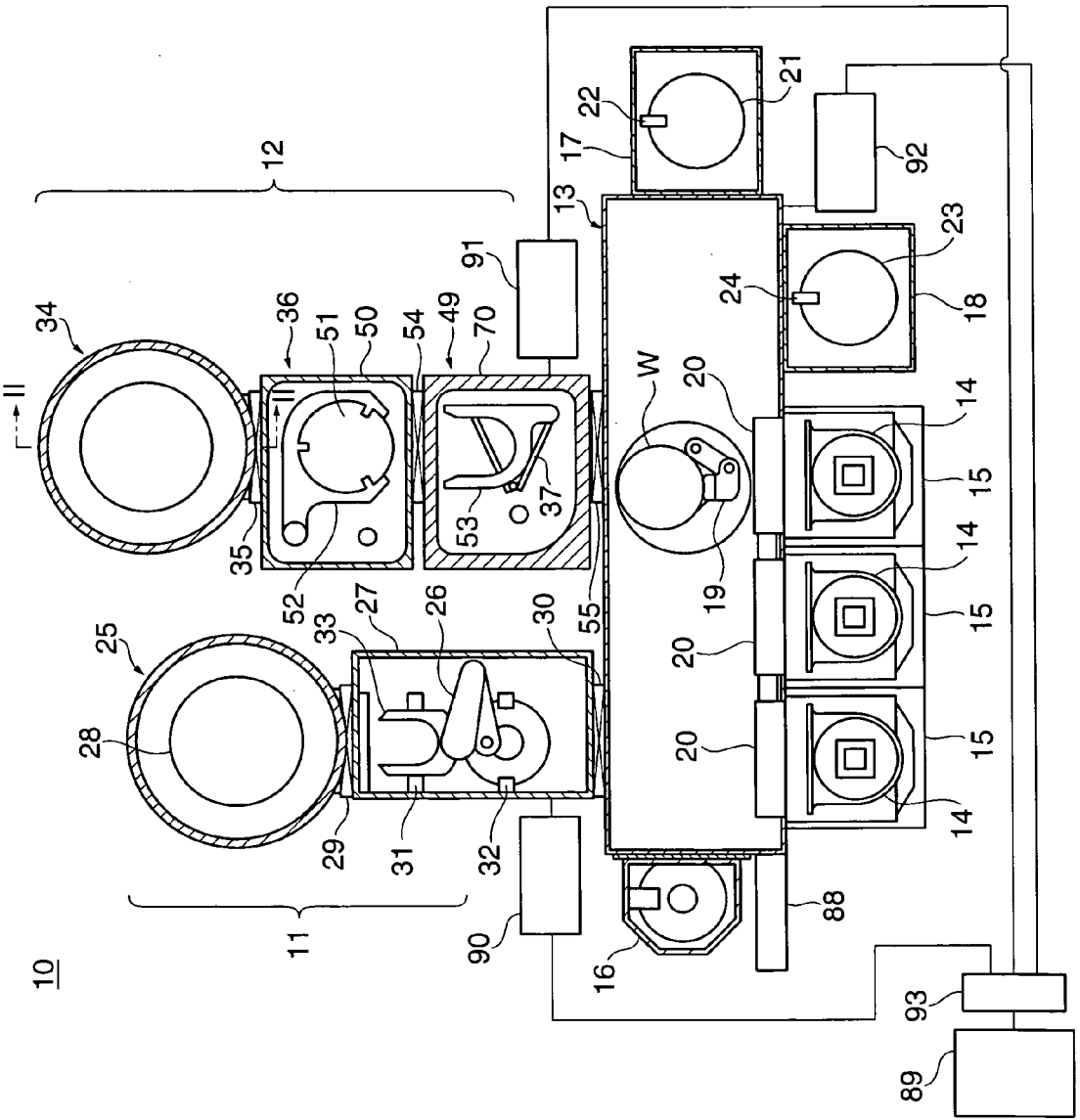
FIG. 1 is a plan view schematically showing the construction of a substrate processing apparatus to which is applied a method of processing a substrate according to an embodiment of the present invention.

FIG. 1 is a plan view schematically showing the construction of a substrate processing apparatus to which is applied the method of processing a substrate according to the present embodiment.

As shown in FIG. 1, the substrate processing apparatus 10 is comprised of a first process ship 11 for carrying out reactive ion etching (hereinafter referred to as "RIE") processing on electronic device wafers (hereinafter referred to merely as "wafers") (substrates) W, a second process ship 12 that is disposed parallel to the first process ship 11 and is for carrying out COR (chemical oxide removal) processing and PHT (post heat treatment) processing, described below, on the wafers W, and a loader unit 13, which is a rectangular common transfer chamber to which each of the first process ship 11 and the second process ship 12 is connected.

In addition to the first process ship 11 and the second process ship 12, the loader unit 13 has connected thereto three FOUP mounting stages 15 on each of which is mounted a FOUP (front opening unified pod) 14, which is a container housing twenty-five of the wafers W, an orienter 16 that carries out pre-alignment of the position of each wafer W transferred out from a FOUP 14, and first and second IMS's 17 and 18 (Integrated Metrology Systems, made by Therma-Wave, Inc.) for measuring the surface state of each wafer W.

The first process ship 11 and the second process ship 12 are each connected to a side wall of the loader unit 13 in a longitudinal direction of the loader unit 13, disposed facing the three FOUP mounting stages 15 with the loader unit 13 therebetween. The orienter 16 is disposed at one end of the loader unit 13 in the longitudinal direction of the loader unit 13. The first IMS 17 is disposed at the other end of the loader unit 13 in the longitudinal direction of the loader unit 13. The second IMS 18 is disposed alongside the three FOUP mounting stages 15.

A SCARA-type dual arm transfer arm mechanism 19 for transferring the wafers W is disposed inside the loader unit 13, and three loading ports 20 through which the wafers W are introduced into the loader unit 13 are disposed in a side wall of the loader unit 13 in correspondence with the FOUP mounting stages 15. The transfer arm mechanism 19 takes a wafer W out from a FOUP 14 mounted on a FOUP mounting stage 15 through the corresponding loading port 20, and transfers the removed wafer W into and out of the first process ship 11, the second process ship 12, the orienter 16, the first IMS 17, and the second IMS 18.

The first IMS 17 is an optical monitor having a mounting stage 21 on which is mounted a wafer W that has been transferred into the first IMS 17, and an optical sensor 22 that is directed at the wafer W mounted on the mounting stage 21. The first IMS 17 measures the surface shape of the wafer W, for example the thickness of a surface layer, and CD (critical dimension) values of wiring grooves, gate electrodes and so on. Like the first IMS 17, the second IMS 18 is also an optical monitor, and has a mounting stage 23 and an optical sensor 24. The second IMS 18 measures the number of particles on the surface of each wafer W.

The first process ship 11 has a first processing unit 25 as a first vacuum processing chamber in which the RIE processing is carried out on each wafer W, and a first load lock unit 27 containing a link-type single pick-type first transfer arm 26 for transferring each wafer W into and out of the first processing unit 25.

The first processing unit 25 has a cylindrical processing chamber, and an upper electrode and a lower electrode disposed in the chamber. The distance between the upper electrode and the lower electrode is set to an appropriate value for carrying out the RIE processing on each wafer W. Moreover, the lower electrode has in a top portion thereof an ESC (electrostatic chuck) 28 for chucking the wafer W thereto using a Coulomb force or the like.

In the first processing unit 25, a processing gas is introduced into the chamber and an electric field is generated between the upper electrode and the lower electrode, whereby the introduced processing gas is turned into plasma so as to produce ions and radicals. The wafer W is subjected to the RIE processing by the ions and radicals.

In the first process ship 11, the internal pressure of the first processing unit 25 is held at vacuum, whereas the internal pressure of the loader unit 13 is held at atmospheric pressure. The first load lock unit 27 is thus provided with a vacuum gate valve 29 in a connecting part between the first load lock unit 27 and the first processing unit 25, and an atmospheric gate valve 30 in a connecting part between the first load lock unit 27 and the loader unit 13, whereby the first load lock unit 27 is constructed as a preliminary vacuum transfer chamber whose internal pressure can be adjusted.

Within the first load lock unit 27, the first transfer arm 26 is disposed in an approximately central portion of the first load lock unit 27; first buffers 31 are disposed toward the first processing unit 25 with respect to the first transfer arm 26, and second buffers 32 are disposed toward the loader unit 13 with respect to the first transfer arm 26. The first buffers 31 and the second buffers 32 are disposed above a track along which a supporting portion (pick) 33 moves, the supporting portion 33 being disposed at the distal end of the first transfer arm 26 and being for supporting each wafer W. After having being subjected to the RIE processing, each wafer W is temporarily laid by above the track of the supporting portion 33, whereby swapping over of the wafer W that has been subjected to the RIE processing and a wafer W yet to be subjected to the RIE processing can be carried out smoothly in the first processing unit 25.

The second process ship 12 has a second processing unit 34 as a second vacuum processing chamber in which the COR processing is carried out on each wafer W, a third processing unit 36 as a third vacuum processing chamber that is connected to the second processing unit 34 via a vacuum gate valve 35 and in which the PHT processing is carried out on each wafer W, and a second load lock unit 49 containing a link-type single pick-type second transfer arm 37 for transferring each wafer W into and out of the second processing unit 34 and the third processing unit 36.

Figure 2A:
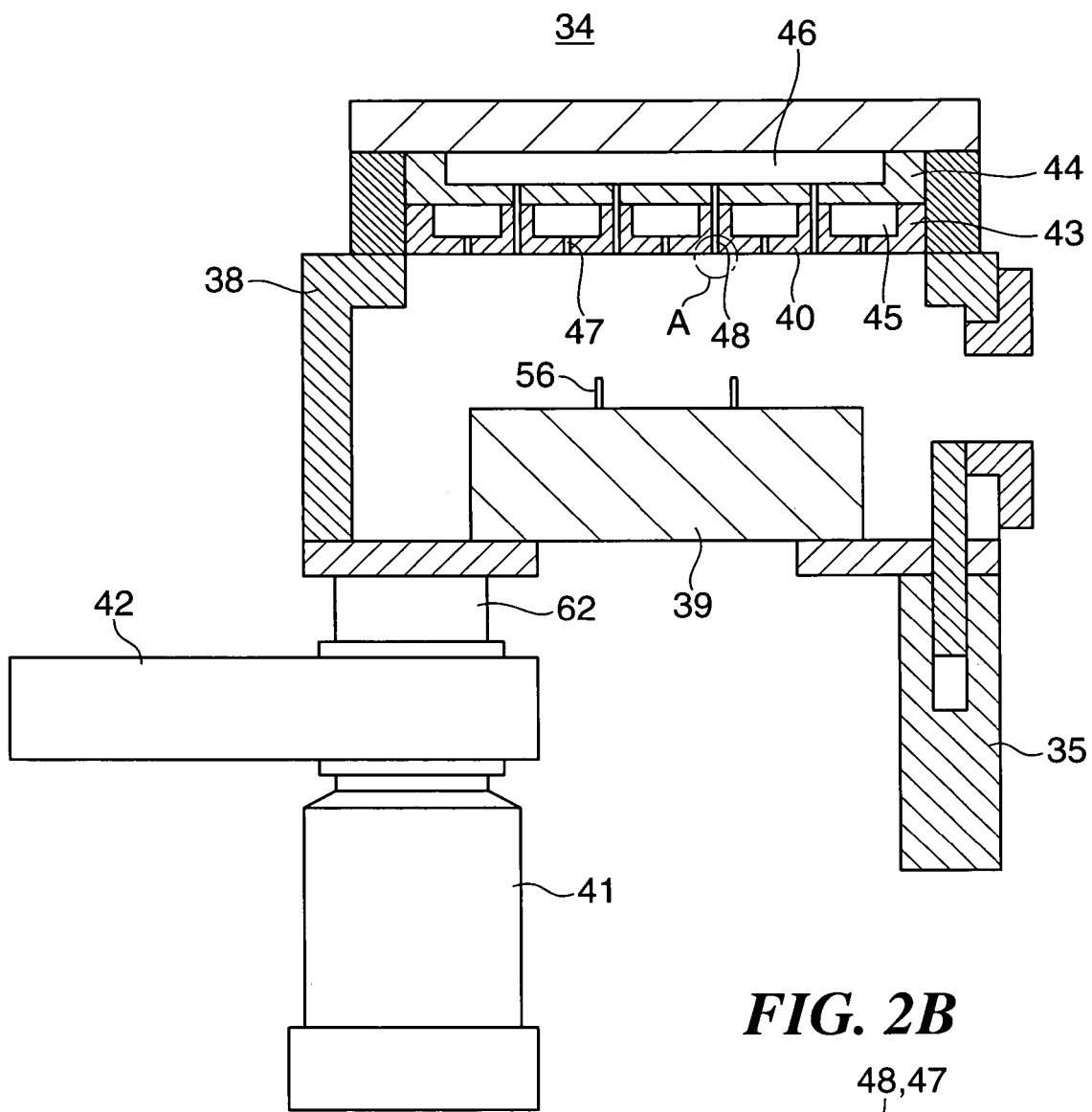
FIGS. 2A and 2B are sectional views of a second processing unit appearing in FIG. 1; specifically.
Figure 2B:
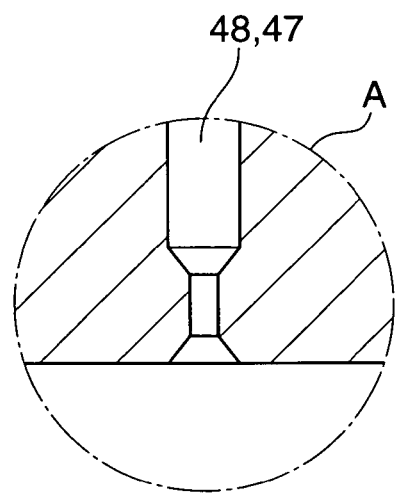

FIGS. 2A and 2B are sectional views of the second processing unit 34 appearing in FIG. 1; specifically, FIG. 2A is a sectional view taken along line II-II in FIG. 1, and FIG. 2B is an enlarged view of a portion A shown in FIG. 2A.

As shown in FIG. 2A, the second processing unit 34 has a cylindrical processing chamber (chamber) 38, an ESC 39 as a wafer W mounting stage disposed in the chamber 38, a shower head 40 disposed above the chamber 38, a TMP (turbo molecular pump) 41 for exhausting gas out from the chamber 38, and an APC (automatic pressure control) valve 42 that is a variable butterfly valve disposed between the chamber 38 and the TMP 41 for controlling the pressure in the chamber 38.

The ESC 39 has therein an electrode plate (not shown) to which a DC voltage is applied. A wafer W is attracted to and held on the ESC 39 through a Johnsen-Rahbek force or a Coulomb force generated by the DC voltage. Moreover, the ESC 39 also has a coolant chamber (not shown) as a temperature adjusting mechanism. A coolant, for example cooling water or a Galden fluid, at a predetermined temperature is circulated through the coolant chamber. A processing temperature of the wafer W held on an upper surface of the ESC 39 is controlled through the temperature of the coolant. Furthermore, the ESC 39 also has a heat-transmitting gas supply system (not shown) that supplies a heat-transmitting gas (helium gas) uniformly between the upper surface of the ESC 39 and a rear surface of the wafer. The heat-transmitting gas carries out heat exchange between the wafer and the ESC 39, which is held at a desired specified temperature by the coolant during the COR processing, thus cooling the wafer efficiently and uniformly.

Moreover, the ESC 39 has a plurality of pusher pins 56 as lifting pins that can be made to project out from the upper surface of the ESC 39. The pusher pins 56 are housed inside the ESC 39 when a wafer W is attracted to and held on the ESC 39, and are made to project out from the upper surface of the ESC 39 so as to lift the wafer W up when the wafer W is to be transferred out from the chamber 38 after having been subjected to the COR processing.

The shower head 40 has a two-layer structure comprised of a lower layer portion 43 and an upper layer portion 44. The lower layer portion 43 has first buffer chambers 45 therein, and the upper layer portion 44 has a second buffer chamber 46 therein. The first buffer chambers 45 and the second buffer chamber 46 are communicated with the chamber 38 via gas-passing holes 47 and 48 respectively. That is, the shower head 40 is comprised of two plate-shaped members (the lower layer portion 43 and the upper layer portion 44) that are disposed on one another and have therein internal channels leading into the chamber 38 for gas supplied into the first buffer chambers 45 and the second buffer chamber 46.

When carrying out the COR processing on a wafer W, $NH_3$ (ammonia) gas is supplied into the first buffer chambers 45 from an ammonia gas supply pipe 57, described below, and the supplied ammonia gas is then supplied via the gas-passing holes 47 into the chamber 38, and moreover HF (hydrogen fluoride) gas is supplied into the second buffer chamber 46 from a hydrogen fluoride gas supply pipe 58, described below, and the supplied hydrogen fluoride gas is then supplied via the gas-passing holes 48 into the chamber 38.

Moreover, the shower head 40 also has a heater, for example a heating element, (not shown) built therein. The heating element is preferably disposed on the upper layer portion 44, for controlling the temperature of the hydrogen fluoride gas in the second buffer chamber 46.

Moreover, a portion of each of the gas-passing holes 47 and 48 where the gas-passing hole 47 or 48 opens out into the chamber 38 is formed so as to widen out toward an end thereof as shown in FIG. 2B. As a result, the ammonia gas and the hydrogen fluoride gas can be made to diffuse through the chamber 38 efficiently. Furthermore, each of the gas-passing holes 47 and 48 has a cross-sectional shape having a constriction therein. As a result, any deposit produced in the chamber 38 can be prevented from flowing back into the gas-passing holes 47 and 48, and thus the first buffer chambers 45 and the second buffer chamber 46. Alternatively, the gas-passing holes 47 and 48 may each have a spiral shape.

In the second processing unit 34, the COR processing is carried out on a wafer W by adjusting the pressure in the chamber 38 and the volumetric flow rate ratio between the ammonia gas and the hydrogen fluoride gas. Moreover, the second processing unit 34 is designed such that the ammonia gas and the hydrogen fluoride gas first mix with one another in the chamber 38 (post-mixing design), and hence the two gases are prevented from mixing together until they are introduced into the chamber 38, whereby the hydrogen fluoride gas and the ammonia gas are prevented from reacting with one another before being introduced into the chamber 38.

Moreover, in the second processing unit 34, a heater, for example a heating element, (not shown) is built into a side wall of the chamber 38, whereby the temperature of the atmosphere in the chamber 38 can be prevented from decreasing. As a result, the reproducibility of the COR processing can be improved. Moreover, the heating element in the side wall also controls the temperature of the side wall, whereby by-products formed in the chamber 38 can be prevented from becoming attached to the inside of the side wall.

Returning to FIG. 1, the third processing unit 36 has a box-shaped processing chamber (chamber) 50, a stage heater 51 as a wafer W mounting stage disposed in the chamber 50, a buffer arm 52 that is disposed around the stage heater 51 and lifts up a wafer W mounted on the stage heater 51, and a PHT chamber lid (not shown) as an openable/closable lid that isolates the interior of the chamber from the external atmosphere.

The stage heater 51 is made of aluminum having an oxide film formed on a surface thereof, and heats the wafer W mounted thereon up to a predetermined temperature through heating wires or the like built therein. Specifically, the stage heater 51 directly heats the wafer W mounted thereon up to 100 to 200° C., preferably approximately 135° C., over at least 1 minute.

The PHT chamber lid has a sheet heater made of silicone rubber disposed thereon. Moreover, a cartridge heater (not shown) is built into a side wall of the chamber 50. The cartridge heater controls the wall surface temperature of the side wall of the chamber 50 to a temperature in a range of 25 to 80° C. As a result, by-products are prevented from becoming attached to the side wall of the chamber 50, whereby particles due to such attached by-products are prevented from arising, and hence the time period between one cleaning and the next of the chamber 50 can be extended. Moreover, an outer periphery of the chamber 50 is covered by a heat shield.

Instead of the sheet heater described above, a UV (ultraviolet) radiation heater may alternatively be used as the heater for heating the wafer W from above. An example of such a UV heater is a UV lamp that emits UV of wavelength 190 to 400 nm.

After being subjected to the COR processing, each wafer W is temporarily laid by above a track of a supporting portion 53 of the second transfer arm 37 by the buffer arm 52, whereby swapping over of wafers W in the second processing unit 34 and the third processing unit 36 can be carried out smoothly.

In the third processing unit 36, the PHT processing is carried out on each wafer W by adjusting the temperature of the wafer W.

The second load lock unit 49 has a box-shaped transfer chamber (chamber) 70 containing the second transfer arm 37. The internal pressure of each of the second processing unit 34 and the third processing unit 36 is held at vacuum, whereas the internal pressure of the loader unit 13 is held at atmospheric pressure. The second load lock unit 49 is thus provided with a vacuum gate valve 54 in a connecting part between the second load lock unit 49 and the third processing unit 36, and an atmospheric door valve 55 in a connecting part between the second load lock unit 49 and the loader unit 13, whereby the second load lock unit 49 is constructed as a preliminary vacuum transfer chamber whose internal pressure can be adjusted.

Figure 3:
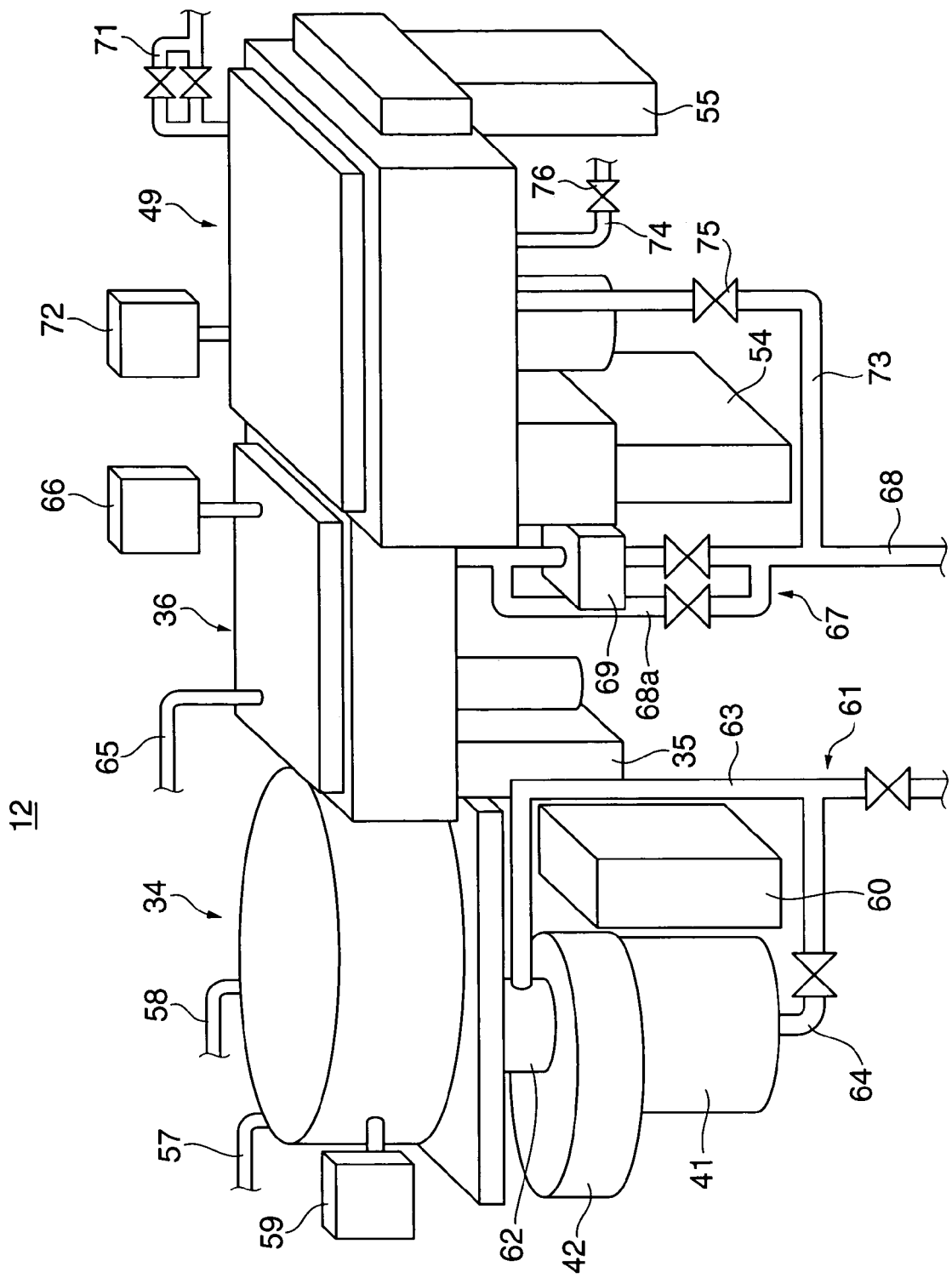
FIG. 3 is a perspective view schematically showing the construction of a second process ship appearing in FIG. 1.

FIG. 3 is a perspective view schematically showing the construction of the second process ship 12 appearing in FIG. 1.

As shown in FIG. 3, the second processing unit 34 has the ammonia gas supply pipe 57 for supplying ammonia gas into the first buffer chambers 45, the hydrogen fluoride gas supply pipe 58 for supplying hydrogen fluoride gas into the second buffer chamber 46, a pressure gauge 59 for measuring the pressure in the chamber 38, and a chiller unit 60 that supplies a coolant into the cooling system provided in the ESC 39.

The ammonia gas supply pipe 57 has provided therein an MFC (mass flow controller) (not shown) for adjusting the flow rate of the ammonia gas supplied into the first buffer chambers 45, and the hydrogen fluoride gas supply pipe 58 has provided therein an MFC (not shown) for adjusting the flow rate of the hydrogen fluoride gas supplied into the second buffer chamber 46. The MFC in the ammonia gas supply pipe 57 and the MFC in the hydrogen fluoride gas supply pipe 58 operate collaboratively so as to adjust the volumetric flow rate ratio between the ammonia gas and the hydrogen fluoride gas supplied into the chamber 38.

Moreover, a second processing unit exhaust system 61 connected to a DP (dry pump) (not shown) is disposed below the second processing unit 34. The second processing unit exhaust system 61 is for exhausting gas out from the chamber 38, and has an exhaust pipe 63 that is communicated with an exhaust duct 62 provided between the chamber 38 and the APC valve 42, and an exhaust pipe 64 connected below (i.e. on the exhaust side) of the TMP 41. The exhaust pipe 64 is connected to the exhaust pipe 63 upstream of the DP.

The third processing unit 36 has a nitrogen gas supply pipe 65 for supplying nitrogen ($N_2$) gas into the chamber 50, a pressure gauge 66 for measuring the pressure in the chamber 50, and a third processing unit exhaust system 67 for exhausting the nitrogen gas out from the chamber 50.

The nitrogen gas supply pipe 65 has provided therein an MFC (not shown) for adjusting the flow rate of the nitrogen gas supplied into the chamber 50. The third processing unit exhaust system 67 has a main exhaust pipe 68 that is communicated with the chamber 50 and is connected to a DP, an APC valve 69 that is disposed part way along the main exhaust pipe 68, and an auxiliary exhaust pipe 68a that branches off from the main exhaust pipe 68 so as to circumvent the APC valve 69 and is connected to the main exhaust pipe 68 upstream of the DP. The APC valve 69 controls the pressure in the chamber 50.

The second load lock unit 49 has a nitrogen gas supply pipe 71 for supplying nitrogen gas into the chamber 70, a pressure gauge 72 for measuring the pressure in the chamber 70, a second load lock unit exhaust system 73 for exhausting the nitrogen gas out from the chamber 70, and an external atmosphere communicating pipe 74 for releasing the interior of the chamber 70 to the external atmosphere.

The nitrogen gas supply pipe 71 has provided therein an MFC (not shown) for adjusting the flow rate of the nitrogen gas supplied into the chamber 70. The second load lock unit exhaust system 73 is comprised of a single exhaust pipe, which is communicated with the chamber 70 and is connected to the main exhaust pipe 68 of the third processing unit exhaust system 67 upstream of the DP. Moreover, the second load lock unit exhaust system 73 has an openable/closable exhaust valve 75 therein, and the external atmosphere communicating pipe 74 has an openable/closable relief valve 76 therein. The exhaust valve 75 and the relief valve 76 are operated collaboratively so as to adjust the pressure in the chamber 70 to any pressure from atmospheric pressure to a desired degree of vacuum.

Figure 4:
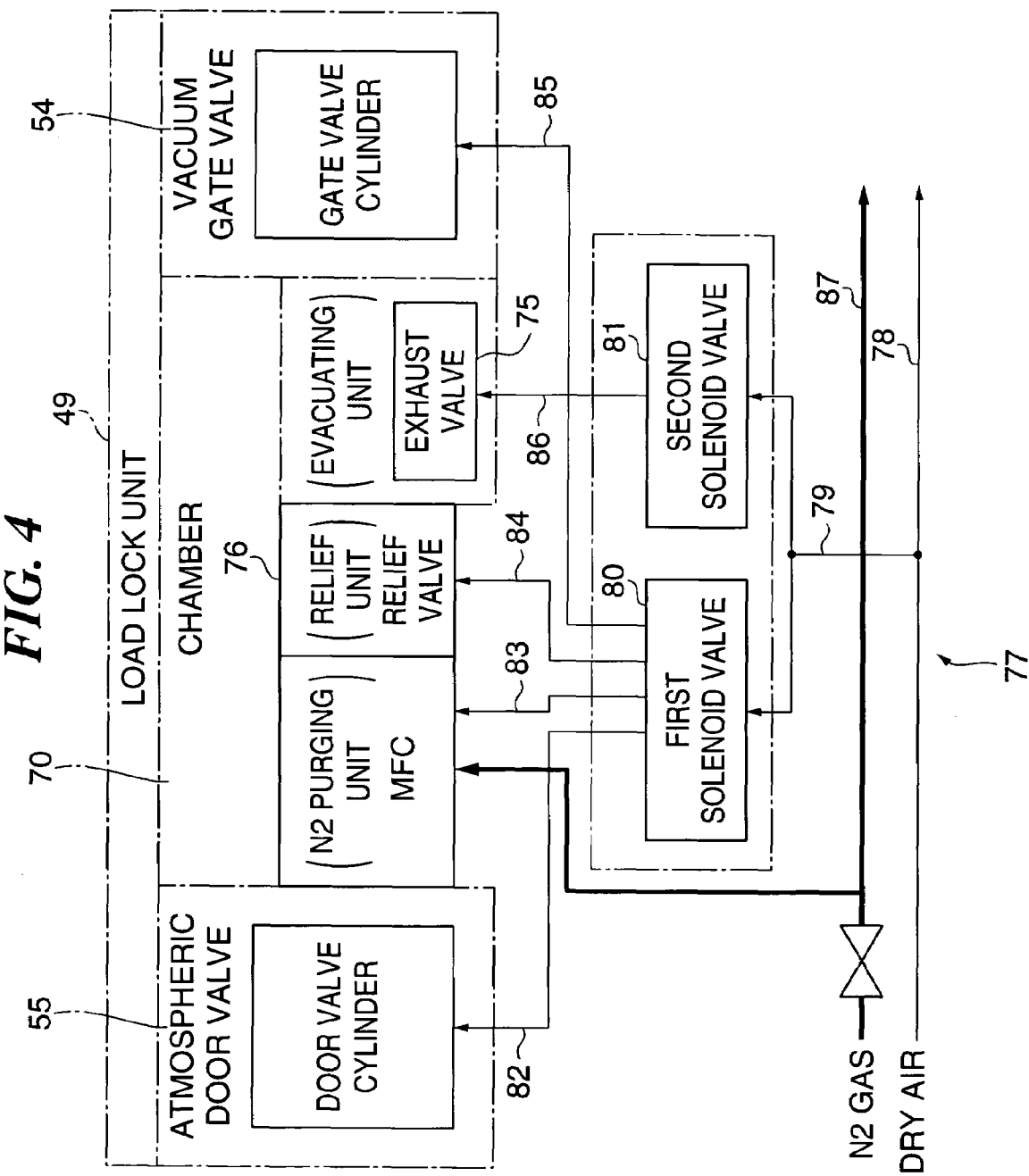
FIG. 4 is a diagram schematically showing the construction of a unit-driving dry air supply system for a second load lock unit appearing in FIG. 3.

FIG. 4 is a diagram schematically showing the construction of a unit-driving dry-air supply system for the second load lock unit 49 appearing in FIG. 3.

As shown in FIG. 4, dry air from the unit-driving dry air supply system 77 for the second load lock unit 49 is supplied to a door valve cylinder for driving a sliding door of the atmospheric door valve 55, the MFC in the nitrogen gas supply pipe 71 as an $N_2$ purging unit, the relief valve 76 in the external atmosphere communicating pipe 74 as a relief unit for releasing the interior of the chamber 70 to the external atmosphere, the exhaust valve 75 in the second load lock unit exhaust system 73 as an evacuating unit, and a gate valve cylinder for driving a sliding gate of the vacuum gate valve 54.

The unit-driving dry air supply system 77 has an auxiliary dry air supply pipe 79 that branches off from a main dry air supply pipe 78 of the second process ship 12, and a first solenoid valve 80 and a second solenoid valve 81 that are connected to the auxiliary dry air supply pipe 79.

The first solenoid valve 80 is connected respectively to the door valve cylinder, the MFC, the relief valve 76, and the gate valve cylinder by dry air supply pipes 82, 83, 84, and 85, and controls operation of these elements by controlling the amount of dry air supplied thereto. Moreover, the second solenoid valve 81 is connected to the exhaust valve 75 by a dry air supply pipe 86, and controls operation of the exhaust valve 75 by controlling the amount of dry air supplied to the exhaust valve 75.

The MFC in the nitrogen gas supply pipe 71 is also connected to a nitrogen ($N_2$) gas supply system 87.

The second processing unit 34 and the third processing unit 36 also each has a unit-driving dry air supply system having a similar construction to the unit-driving dry air supply system 77 for the second load lock unit 49 described above.

Returning to FIG. 1, the substrate processing apparatus 10 has a system controller for controlling operations of the first process ship 11, the second process ship 12 and the loader unit 13, and an operation controller 88 that is disposed at one end of the loader unit 13 in the longitudinal direction of the loader unit 13.

The operation controller 88 has a display section comprised of, for example, an LCD (liquid crystal display), for displaying the state of operation of the component elements of the substrate processing apparatus 10.

Figure 5:
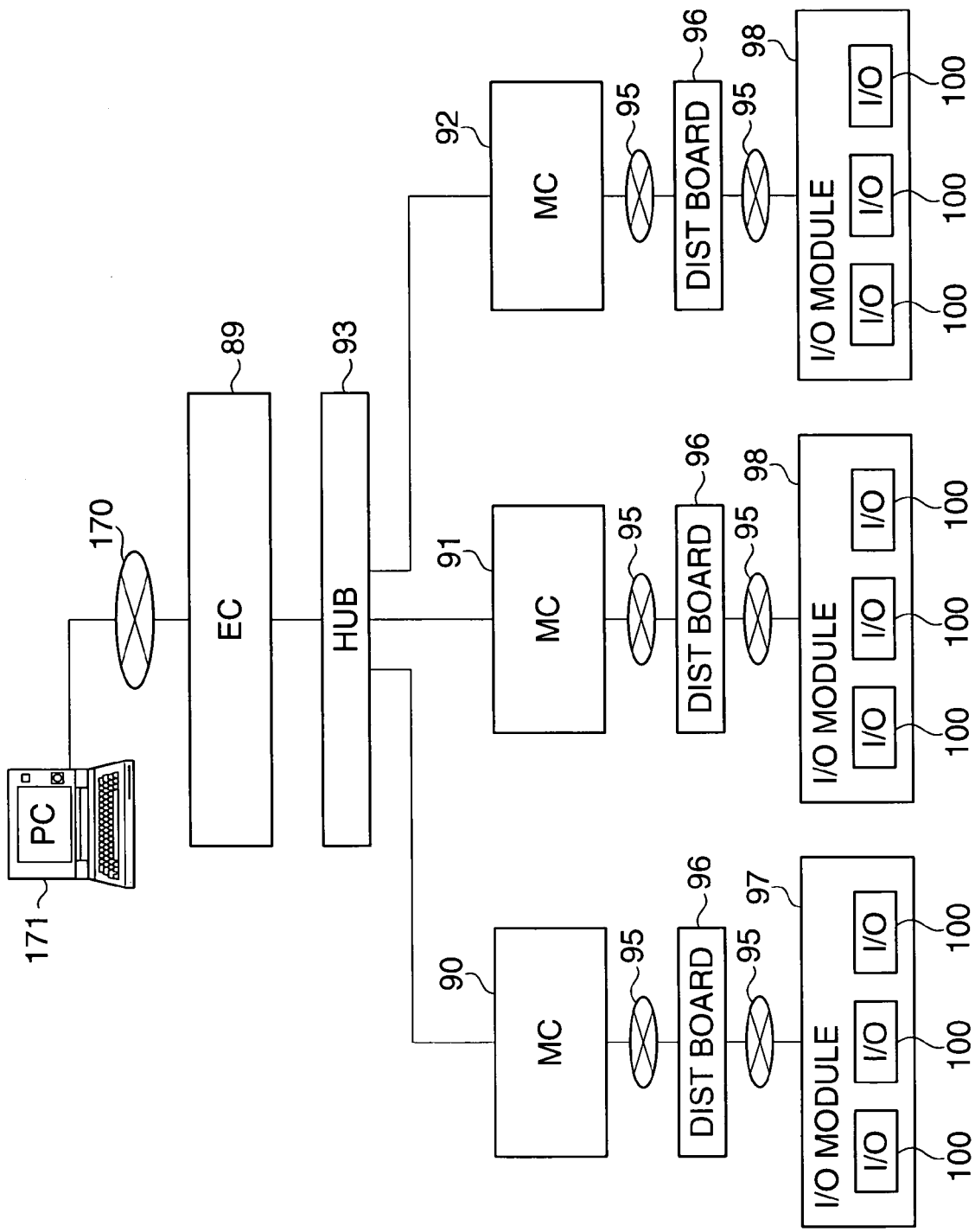
FIG. 5 is a diagram schematically showing the construction of a system controller for the substrate processing apparatus shown in FIG. 1.

Moreover, as shown in FIG. 5, the system controller is comprised of an EC (equipment controller) 89, three MC's (module controllers) 90, 91 and 92, and a switching hub 93 that connects the EC 89 to each of the MC's. The EC 89 of the system controller is connected via a LAN (local area network) 170 to a PC 171, which is an MES (manufacturing execution system) that carries out overall control of the manufacturing processes in the manufacturing plant in which the substrate processing apparatus 10 is installed. In collaboration with the system controller, the MES feeds back real real-time data on the processes in the manufacturing plant to a basic work system (not shown), and makes decisions relating to the processes in view of the overall load on the manufacturing plant and so on.

The EC 89 is a master controller (main controller) that controls the MC's and carries out overall control of the operation of the substrate processing apparatus 10. The EC 89 has a CPU, a RAM, an HDD and so on. The CPU sends control signals to the MC's in accordance with programs corresponding to wafer W processing methods, i.e. recipes, specified by a user using the operation controller 88, thus controlling the operations of the first process ship 11, the second process ship 12 and the loader unit 13.

The switching hub 93 selects at least one connection among the connections between the EC 89 and MC's in accordance with the control signals from the EC 89.

The MC's 90, 91 and 92 are slave controllers (auxiliary controllers) that control the operations of the first process ship 11, the second process ship 12, and the loader unit 13 respectively. Each of the MC's is connected respectively to an I/O (input/output) module 97, 98 or 99 through a DIST (distribution) board 96 via a GHOST network 95. Each GHOST network 95 is a network that is realized through an LSI known as a GHOST (general high-speed optimum scalable transceiver) on an MC board of the corresponding MC. A maximum of 31 I/O modules can be connected to each GHOST network 95; with respect to the GHOST network 95, the MC is the master, and the I/O modules are slaves.

The I/O module 98 is comprised of a plurality of I/O units 100 that are connected to component elements (hereinafter referred to as "end devices") of the second process ship 12, and transmits control signals to the end devices and output signals from the end devices. Examples of the end devices connected to the I/O units 100 of the I/O module 98 are: in the second processing unit 34, the MFC in the ammonia gas supply pipe 57, the MFC in the hydrogen fluoride gas supply pipe 58, the pressure gauge 59, and the APC valve 42; in the third processing unit 36, the MFC in the nitrogen gas supply pipe 65, the pressure gauge 66, the APC valve 69, the buffer arm 52, and the stage heater 51; in the second load lock unit 49, the MFC in the nitrogen gas supply pipe 71, the pressure gauge 72, and the second transfer arm 37; and in the unit-driving dry air supply system 77, the first solenoid valve 80, and the second solenoid valve 81.

Each of the I/O modules 97 and 99 has a similar construction to the I/O module 98. Moreover, the connection between the I/O module 97 and the MC 90 for the first process ship 11, and the connection between the I/O module 99 and the MC 92 for the loader unit 13 are constructed similarly to the connection between the I/O module 98 and the MC 91 described above, and hence description thereof is omitted.

Each GHOST network 95 is also connected to an I/O board (not shown) that controls input/output of digital signals, analog signals and serial signals to/from the I/O units 100.

In the substrate processing apparatus 10, when carrying out the COR processing on a wafer W, the CPU of the EC 89 implements the COR processing in the second processing unit 34 by sending control signals to desired end devices via the switching hub 93, the MC 91, the GHOST network 95, and the I/O units 100 of the I/O module 98, in accordance with a program corresponding to a recipe for the COR processing.

Specifically, the CPU sends control signals to the MFC in the ammonia gas supply pipe 57 and the MFC in the hydrogen fluoride gas supply pipe 58 so as to adjust the volumetric flow rate ratio between the ammonia gas and the hydrogen fluoride gas in the chamber 38 to a desired value, and sends control signals to the TMP 41 and the APC valve 42 so as to adjust the pressure in the chamber 38 to a desired value. Moreover, at this time, the pressure gauge 59 sends the value of the pressure in the chamber 38 to the CPU of the EC 89 in the form of an output signal, and the CPU determines control parameters for the MFC in the ammonia gas supply pipe 57, the MFC in the hydrogen fluoride gas supply pipe 58, the APC valve 42, and the TMP 41 based on the sent value of the pressure in the chamber 38.

Moreover, when carrying out the PHT processing on a wafer W, the CPU of the EC 89 implements the PHT processing in the third processing unit 36 by sending control signals to desired end devices in accordance with a program corresponding to a recipe for the PHT processing.

Specifically, the CPU sends control signals to the MFC in the nitrogen gas supply pipe 65, and the APC valve 69 so as to adjust the pressure in the chamber 50 to a desired value, and sends control signals to the stage heater 51 so as to adjust the temperature of the wafer W to a desired temperature. Moreover, at this time, the pressure gauge 66 sends the value of the pressure in the chamber 50 to the CPU of the EC 89 in the form of an output signal, and the CPU determines control parameters for the APC valve 69, and the MFC in the nitrogen gas supply pipe 65 based on the sent value of the pressure in the chamber 50.

According to the system controller shown in FIG. 5, the plurality of end devices are not directly connected to the EC 89, but rather the I/O units 100 which are connected to the plurality of end devices are modularized to form the I/O modules, and each I/O module is connected to the EC 89 via an MC and the switching hub 93. As a result, the communication system can be simplified.

Moreover, each of the control signals sent by the CPU of the EC 89 contains the address of the I/O unit 100 connected to the desired end device, and the address of the I/O module containing that I/O unit 100. The switching hub 93 thus refers to the address of the I/O module in the control signal, and then the GHOST of the appropriate MC refers to the address of the I/O unit 100 in the control signal, whereby the need for the switching hub 93 or the MC to ask the CPU for the destination of the control signal can be eliminated, and hence smoother transmission of the control signals can be realized.

As described earlier, to improve precision of alignment during manufacture so as to improve the light collecting ability of a solid-state imaging device, an insulating film ($SiO_2$ film) must be made thin. Moreover, it is necessary to prevent the solid-state imaging device from being damaged when making the insulating film thin.

In the method of processing a substrate according to the present embodiment, to achieve this, a wafer W is subjected to COR processing and PHT processing so as to make an insulating film thin without damaging a solid-state imaging device.

The COR processing is processing in which an oxide film on an object to be processed (the substrate) is made to undergo chemical reaction with gas molecules to produce a product, and the PHT processing is processing in which the object to be processed that has been subjected to the COR processing is heated so as to vaporize/thermally oxidize the product that has been produced on the object to be processed through the chemical reaction in the COR processing, thus removing the product from the object to be processed. As described above, the COR processing and the PHT processing are (particularly the COR processing is) processing in which the oxide film on the object to be processed is removed without using plasma and without using water, and hence are categorized as plasma-less etching or dry cleaning.

In the method of processing a substrate according to the present embodiment, ammonia gas and hydrogen fluoride gas are used as the gas. Here, the hydrogen fluoride gas promotes corrosion of the $SiO_2$ layer, and the ammonia gas is involved in synthesis of a reaction by-product for restricting, and ultimately stopping, the reaction between the oxide film and the hydrogen fluoride gas as required. Specifically, the following chemical reactions are used in the COR processing and the PHT processing, whereby an upper layer of the $SiO_2$ insulating film is removed so as to make the insulating film have a desired film thickness.

(COR PROCESSING)

$$SiO_2 + 4HF \rightarrow SiF_4 + 2H_2O\uparrow$$

$$SiF_4 + 2NH_3 + 2HF \rightarrow (NH_4)_2SiF_6$$

(PHT PROCESSING)

$$(NH_4)_2SiF_6 \rightarrow SiF_4\uparrow + 2NH_3\uparrow + 2HF\uparrow$$

It has been found by the present inventors that the COR processing and PHT processing using the above chemical reactions exhibit the following characteristics. Incidentally, small amounts of $N_2$ and $H_2$ are also produced in the PHT processing.

1) Selectivity (Removal Rate) for Thermal Oxide Film is High

Specifically, according to the COR processing and PHT processing, the selectivity for a thermal oxide film is high, whereas the selectivity for polysilicon is low. The upper layer of the $SiO_2$ insulating film, which is a thermal oxide film, or a pseudo-$SiO_2$ layer, which has similar properties to such an $SiO_2$ film, can thus be removed efficiently. Note that such a pseudo-$SiO_2$ layer is also known as an "altered layer" or a "sacrificial layer".

2) Rate of Growth of Native Oxide Film on Surface of Insulating Film from which Upper Layer etc. has been Removed is Slow Specifically, the time taken for growth of a native oxide film of thickness 3 Å on the surface of an insulating film from which the upper layer has been removed by wet etching is 10 minutes, whereas the time taken for growth of a native oxide film of thickness 3 Å on the surface of an insulating film from which the upper layer has been removed by the COR processing and the PHT processing is over 2 hours. There is thus no unwanted oxide film formation in an electronic device manufacturing process, and hence the reliability of the electronic device can be improved.

3) Reaction Proceeds in Dry Environment

Specifically, water is not used in the reaction in the COR processing, and moreover any water produced through the COR processing is vaporized in the PHT processing. There are thus no OH groups on the surface of the insulating film from which the upper layer has been removed. The surface of the insulating film thus does not become hydrophilic, and hence the surface does not absorb moisture. A decrease in electronic device wiring reliability can thus be prevented.

4) Amount Produced of Product Levels Off after a Certain Time has Elapsed

Specifically, once a certain time has elapsed, even if the insulating film continues to be exposed to the mixed gas of ammonia gas and hydrogen fluoride gas beyond this, there is no further increase in the amount produced of the product. Moreover, the amount produced of the product is determined by parameters of the mixed gas such as the partial pressure of the mixed gas and the volumetric flow rate ratio, and parameters such as the pressure in the chamber 38 and the heating temperature on the stage heater 51. Control of the amount removed of the insulating film can thus be carried out precisely and easily.

5) Very Little Particle Formation

Specifically, even upon implementing insulating film upper layer removal for 2000 wafers W in the second processing unit 34 and the third processing unit 36, hardly any attachment of particles to the inner wall of the chamber 38 or the chamber 50 is observed. Problems due to particles such as short-circuiting of the electronic device wiring thus do not occur, and hence the reliability of the electronic device can be improved.

Next, the method of processing a substrate according to the present embodiment will be described.

In the processing of the present embodiment, in an electronic device manufacturing process, an insulating film made of $SiO_2$ is etched to a desired film thickness. Specifically, in a process of manufacturing a CCD sensor as the electronic device, at least one of a flattening film on which color filters are to be formed, and a protective film for the color filters is etched to a desired film thickness.

Figure 6A:
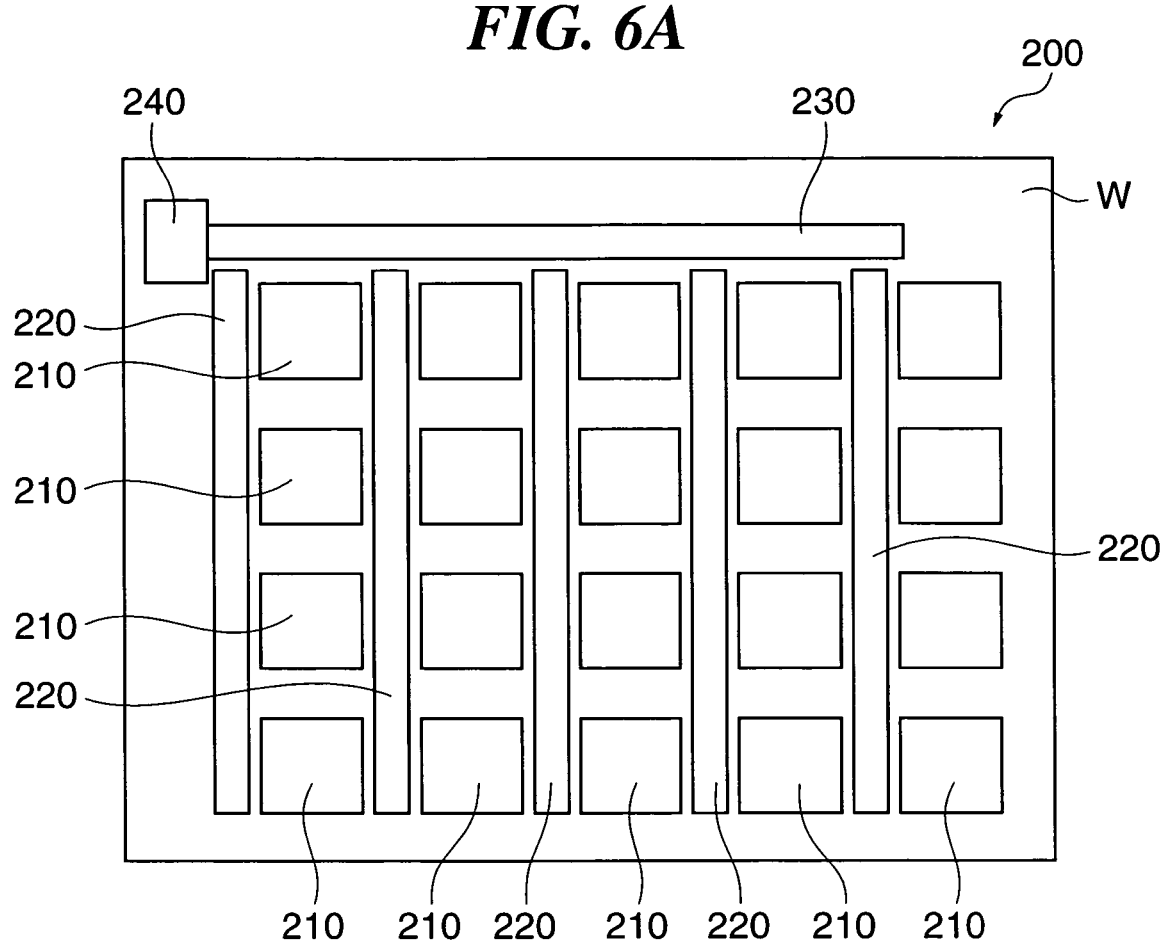
FIGS. 6A and 6B are views schematically showing the construction of a CCD sensor to which is applied the method of processing a substrate according to the above embodiment; specifically.
Figure 6B:
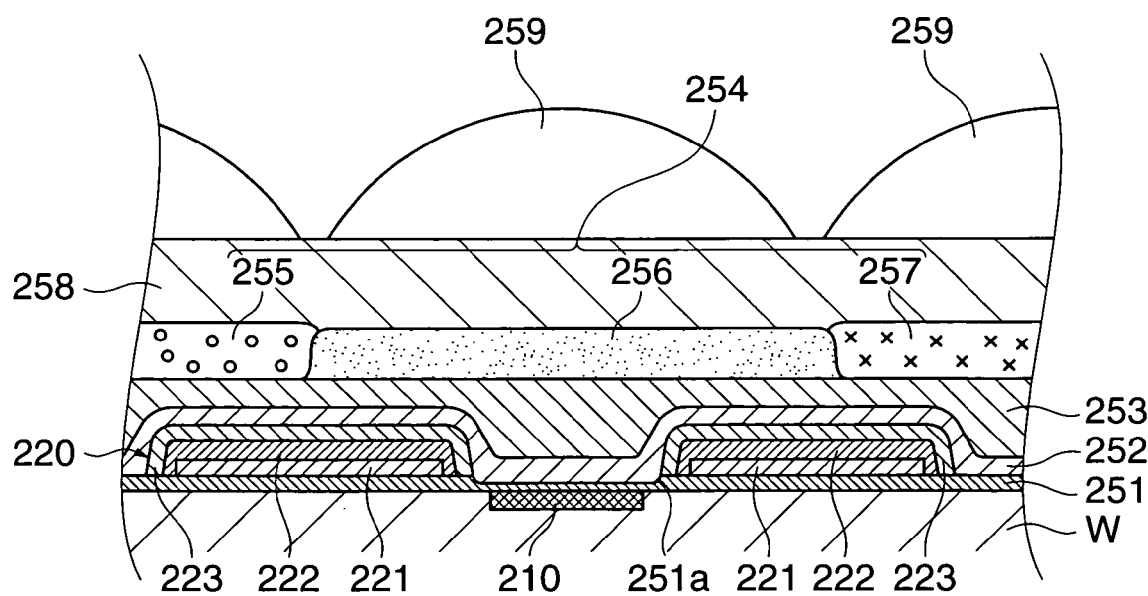

FIGS. 6A and 6B are views schematically showing the construction of the CCD sensor to which is applied the method of processing a substrate according to the present embodiment; specifically FIG. 6A is a view useful in explaining elements on a wafer W in the CCD sensor, and FIG. 6B is a sectional view of part of the CCD sensor.

As shown in FIG. 6A, the CCD sensor 200 has the wafer W, a plurality of photoelectric transducers (chips) 210 as light-receiving portions provided in a matrix shape on the wafer W, a plurality of vertical transfer register units 220 provided along columns of the photoelectric transducers 210 in a vertical direction in FIG. 6A, a horizontal transfer register unit 230 provided along a row of the photoelectric transducers 210 in a horizontal direction in FIG. 6A above the vertical transfer register units 220 in FIG. 6A, and an output section 240 connected to the horizontal transfer register unit 230.

Each of the photoelectric transducers 210 is constructed as, for example, a photodiode, and converts light incident from a light-receiving surface into a signal charge corresponding to the amount of the light. The vertical transfer register units 220 have switching elements and wiring, not shown, and receive the signal charges accumulated on the photoelectric transducers 210 via readout gate sections, not shown, and transfer the signal charges in a vertical direction. The horizontal transfer register unit 230 transfers in a horizontal direction the signal charges received from the vertical transfer register units 220, and sends the signal charges to the output section 240. The output section 240 outputs as image signals the signal charges received from the horizontal transfer register unit 230.

Moreover, as shown in FIG. 6B, an insulating film 251 comprised of an $SiO_2$ oxide film is formed on the wafer W, and each of the vertical transfer register units 220 is comprised of a transfer electrode (signal charge transfer portion) 221 formed on the insulating film 251, an interlayer insulating film 222, and a light-shielding film 223 made of a metal such as aluminum formed so as to cover the transfer electrode 221 via the interlayer insulating film 222. Moreover, the CCD sensor 200 has a silicon nitride film 252 as a protective film made of $Si_3N_4$ formed on the wafer W so as to cover the photoelectric transducers 210 and the vertical transfer register units 220, a flattening film 253 made of an insulating material ($SiO_2$) having a lower refractive index than the silicon nitride film 252, the flattening film 253 being formed so as to cover the silicon nitride film 252 and having a flattened upper surface, color filter 254 comprised of green color filters 255, red color filters 256 and blue color filters 257 formed on the flattening film 253, a protective film 258 made of an insulating material ($SiO_2$) formed on the color filter 254, and microlenses 259 formed on the protective film 258.

FIGS. 7A to 7E constitute a process diagram showing the method of processing a substrate according to the present embodiment.

In the following, a description is given for the case that the processing of the present embodiment is implemented for forming the flattening film 253 in the CCD sensor 200 shown in FIGS. 6(A) and (B). The processing of the present embodiment can also be implemented when forming the protective film 258, in which case the processing is carried out similarly to when forming the flattening film 253, and hence description will be omitted.

First, before the processing of the present embodiment, the insulating film 251 is formed on the wafer W on which the photoelectric transducers 210 have been formed in the matrix shape, a conductive film made of a conductive material such as polysilicon or amorphous silicon is formed, and a photoresist layer is formed in a predetermined pattern for forming the transfer electrodes 221. Next, the conductive film is etched by RIE processing using the photoresist layer as a mask, thus forming the transfer electrodes 221.

Next, an insulating film for forming the interlayer insulating films 222 is formed, and the insulating film is similarly etched by RIE processing using a photoresist layer as a mask, thus forming the interlayer insulating films 222. Next, a conductive metallic film for forming the light-shielding films 223 is formed, and this metallic film and the insulating film 251 as far as close to immediately above the photoelectric transducers 210 are similarly etched by RIE processing using a photoresist layer as a mask, thus forming the light-shielding films 223 and holes 251a. The silicon nitride film 252 made of $Si_3N_4$ is then formed over the whole surface, and then an insulating film 261 made of $SiO_2$ having a predetermined thickness is formed over the whole surface (see FIG. 7A). The insulating film 261 is formed thicker than a desired thickness of the flattening film 253, so that the flattening film 253 can be formed to the desired thickness through the processing of the present embodiment.

Figure 7A:
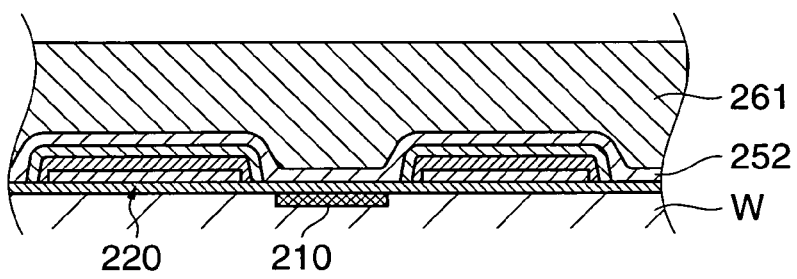
FIGS. 7A to 7E constitute a process diagram showing the method of processing a substrate according to the above embodiment.
Figure 7B:
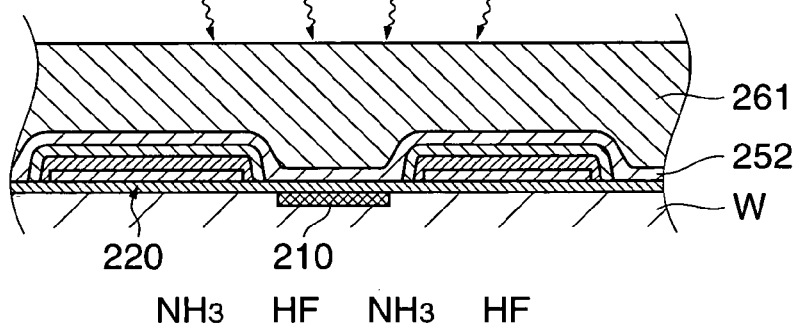
Figure 7C:
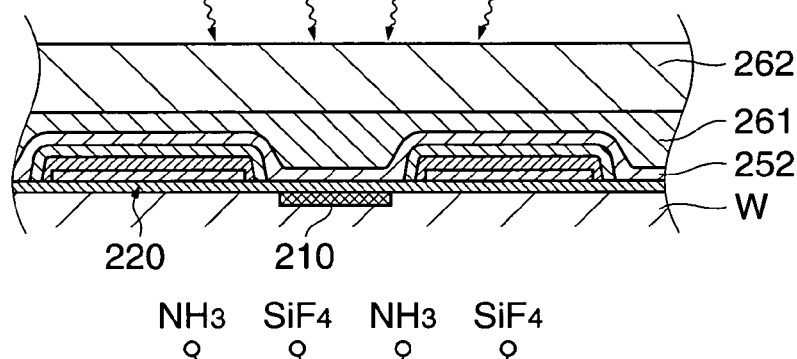
Figure 7D:
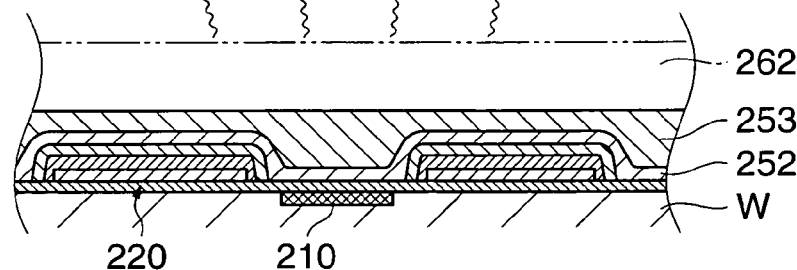
Figure 7E:
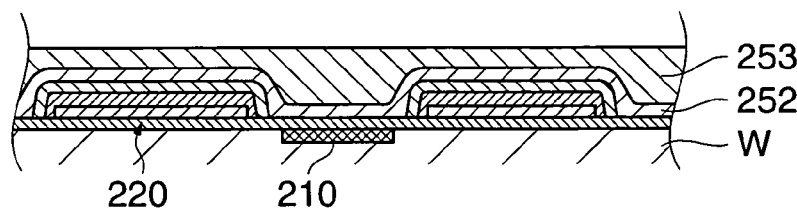

In the processing of the present embodiment, first, to form the flattening film 253 to the desired thickness described above, the wafer W on which the insulating film 261 has been formed (see FIG. 7A) is housed in the chamber 38 of the second processing unit 34, the pressure in the chamber 38 is adjusted to a predetermined pressure, ammonia gas, hydrogen fluoride gas, and argon (Ar) gas as a diluent gas are introduced into the chamber 38 to produce an atmosphere of a mixed gas comprised of ammonia gas, hydrogen fluoride gas and argon gas in the chamber 38, and the insulating film 261 is exposed to the atmosphere of the mixed gas under the predetermined pressure (insulating film exposure step) (see FIG. 7B). As a result, a product having a complex structure is produced from the $SiO_2$ constituting the insulating film 261, the ammonia gas and the hydrogen fluoride gas, whereby an upper layer of the insulating film 261 is altered into a product layer 262 made of the product (see FIG. 7C).

Next, the wafer W on which the product layer 262 has been formed is mounted on the stage heater 51 in the chamber 50 of the third processing unit 36, the pressure in the chamber 50 is adjusted to a predetermined pressure, nitrogen gas is introduced into the chamber 50 to produce viscous flow, and the wafer W is heated to a predetermined temperature using the stage heater 51 (insulating film heating step). At this time, the complex structure of the product in the product layer 262 is thermally decomposed, the product being separated into silicon tetrafluoride ($SiF_4$), ammonia, and hydrogen fluoride, which are vaporized (see FIG. 7D). The vaporized molecules are entrained in the viscous flow, and thus discharged from the chamber 50 by the third processing unit exhaust system 67. As a result, the upper layer of the insulating film 261 is removed, whereby the flattening film 253 of the desired thickness is formed (see FIG. 7E).

In the processing described above, the film thickness of the flattening film 253 to be formed is determined by the thickness of the product layer 262. The amount produced of the product is determined by parameters of the mixed gas of ammonia gas and hydrogen fluoride gas such as the partial pressure of the mixed gas and the volumetric flow rate ratio of the hydrogen fluoride gas to the ammonia gas, and parameters such as the pressure in the chamber 38 and the heating temperature of the wafer W mounted on the stage heater 51. The thickness of the product layer 262 can thus be easily adjusted by controlling the above parameters of the mixed gas and so on. By controlling the parameters of the mixed gas and so on such as the pressure of the mixed gas and the volumetric flow rate ratio, the flattening film 253 can thus be formed precisely to the desired thickness. As a result, the flattening film 253 in the CCD sensor 200 can be made thin.

The method of adjusting the thickness of the product layer 262, and hence controlling the film thickness of the flattening film 253, will now be described in detail. First, before subjecting the wafer W to the COR processing, the surface shape of the insulating film 261, for example a CD value of the film thickness of the insulating film 261, is measured (pre-processing shape measuring step). Next, the CPU of the EC 89 compares the measured surface shape value with a preset desired film thickness of the flattening film 253, and decides a COR processing condition parameter (first processing condition) and a PHT processing condition parameter (second processing condition) based on removal amount data that shows the relationship of the amount removed of the upper layer of the insulating film 261, which relates to the surface shape of the insulating film 261 and the desired film thickness of the flattening film 253 (processing condition deciding step). The removal amount data is preset through, for example, experiments. The removal amount data and data on the desired film thickness of the flattening film 253 are stored in a memory section of the EC 89 in advance. Examples of the COR processing condition parameter are parameters of the mixed gas of ammonia gas and hydrogen fluoride gas such as the partial pressure of the mixed gas and the volumetric flow rate ratio of the hydrogen fluoride gas to the ammonia gas, and the pressure in the chamber 38, and an example of the PHT processing condition parameter is the heating temperature of the wafer W mounted on the stage heater 51. As a result of the above, the amount removed of the upper layer of the insulating film 261 (the amount of growth in the film thickness of the product layer 262) can be controlled precisely, and hence the flattening film 253 can be formed precisely to the desired thickness, and thus the flattening film 253 can be made thin. Moreover, the efficiency of the processing to make the flattening film 253 thin can be improved.

Next, the surface shape of the insulating film 261 after the COR processing and PHT processing is measured (post-processing shape measuring step). The CPU of the EC 89 then compares the measured surface shape value with the desired film thickness of the flattening film 253, and based on the removal amount data described above, changes the COR processing condition parameter and the PHT processing condition parameter that were decided as described above (processing condition changing step). As a result, the amount removed of the upper layer of the insulating film 261 can be controlled yet more precisely, and hence the flattening film 253 can be formed yet more precisely to the desired thickness, and thus the flattening film 253 can be made yet thinner. Moreover, the efficiency of the processing to make the flattening film 253 thin can be further improved.

Moreover, before subjecting each wafer W to the COR processing, it is preferable to measure the surface shape of the insulating film 261, for example a CD value of the film thickness of the insulating film 261, and in accordance with the measured surface shape value, for the CPU of the EC 89 to decide the values of processing condition parameters in the COR processing and PHT processing based on a predetermined relationship between the surface shape of the insulating film 261 and processing condition parameters relating to the amount removed of the upper layer of the insulating film 261. As a result, the amount removed of the upper layer of the insulating film 261 (the amount of growth in the film thickness of the product layer 262) can be controlled precisely, and hence the flattening film 253 can be formed precisely to the desired thickness, and thus the flattening film 253 can be made thin. Moreover, the efficiency of the processing to make the flattening film 253 thin can be improved.

The above predetermined relationship is set based on the difference in the surface shape of the insulating film 261 between before and after carrying out the COR processing and PHT processing as measured by the first IMS 17 at the start of a lot in which a plurality of wafers W are to be processed, i.e. the amount removed of the upper layer of the insulating film 261 by the COR processing and PHT processing, and the processing condition parameters in the COR processing and PHT processing at this time. As described above, examples of the processing condition parameters include the pressure of the mixed gas of ammonia gas and hydrogen fluoride gas, the volumetric flow rate ratio of the hydrogen fluoride gas to the ammonia gas, the predetermined pressure in the chamber 38, and the heating temperature of the wafer W mounted on the stage heater 51. The predetermined relationship thus set is stored in the HDD of the EC 89 or the like, and is referred to as the processing condition parameters as described above when processing subsequent wafers W in the lot.

Moreover, whether or not to re-perform the COR processing and PHT processing on a wafer W may be decided based on the difference in the surface shape of the insulating film 261 between before and after performing the COR processing and PHT processing on that wafer W, and furthermore in the case that it is decided to re-perform the COR processing and PHT processing, the CPU of the EC 89 may decide the processing condition parameters for the COR processing and PHT processing based on the above predetermined relationship in accordance with the surface shape of the insulating film 261 after carrying out the COR processing and PHT processing on the wafer W in question the first time.

Furthermore, it is also possible to adopt a method in which the surface shape of the insulating film 261 after the COR processing and PHT processing is measured by the first IMS 17 at a preset measurement point on each of the photoelectric transducers 210, and the wafer W is only transferred to the next step if the insulating film 261 has been removed down to the desired film thickness at all of the measurement points. As a result, the proportion of non-defective CCD sensors 200 can be improved.

In the second processing unit 34, because hydrogen fluoride gas readily reacts with moisture, it is preferable to set the volume of the ammonia gas to be greater than the volume of the hydrogen fluoride gas in the chamber 38, and moreover it is preferable to remove water molecules from the chamber 38 as much as possible. Specifically, the volumetric flow rate (SCCM) ratio of the hydrogen fluoride gas to the ammonia gas in the mixed gas in the chamber 38 is preferably in a range of 1 to ½, and moreover the predetermined pressure in the chamber 38 is preferably in a range of $6.7 \times 10^{-2}$ to 4.0 Pa (0.5 to 30 mTorr). As a result, the flow rate ratio for the mixed gas in the chamber 38 and so on is stabilized, and hence production of the product can be promoted.

Moreover, if the predetermined pressure in the chamber 38 is in a range of $6.7 \times 10^{-2}$ to 4.0 Pa (0.5 to 30 mTorr), then the amount produced of the product can be made to level off reliably after a certain time has elapsed, whereby the etching depth (amount removed) can be reliably controlled (i.e. is self-limited). For example, in the case that the predetermined pressure in the chamber 38 is 1.3 Pa (10 mTorr), the etching stops proceeding after approximately 3 minutes has elapsed from commencement of the COR processing, and the etching depth at this time is approximately 15 nm. Moreover, in the case that the predetermined pressure in the chamber 38 is 2.7 Pa (20 mTorr), the etching stops proceeding after approximately 3 minutes has elapsed from commencement of the COR processing, and the etching depth at this time is approximately 24 nm.

Moreover, the reaction to produce the product is promoted at around room temperature, and hence the temperature of the ESC 39 on which the wafer W is mounted is preferably set to 25° C. using the temperature adjusting mechanism (not shown) built therein. Furthermore, the higher the temperature, the less prone by-products formed in the chamber 38 are to become attached to the inner wall of the chamber 38, and hence the temperature of the inner wall of the chamber 38 is preferably set to 50° C. using the heater (not shown) embedded in the side wall of the chamber 38.

The product of the reaction is a complex compound containing coordinate bonds. Such a complex compound is weakly bonded together, and hence undergoes thermal decomposition even at a relatively low temperature. In the third processing unit 36, the predetermined temperature of the wafer W is thus preferably in a range of 80 to 200° C., and furthermore the time for which the wafer W is subjected to the PHT processing is preferably in a range of 60 to 180 seconds. Moreover, to produce viscous flow in the chamber 50, it is undesirable to make the degree of vacuum in the chamber 50 high, and moreover a gas flow of a certain flow rate is required. The predetermined pressure in the chamber 50 is thus preferably in a range of $6.7 \times 10$ to $1.3 \times 10^2$ Pa (500 mTorr to 1 Torr), and the nitrogen gas flow rate is preferably in a range of 500 to 3000 SCCM. As a result, viscous flow can be produced reliably in the chamber 50, and hence gas molecules produced through the thermal decomposition of the product can be reliably removed.

The wafer W on which the flattening film 253 has been formed through the processing of the present embodiment next has the color filters 254 formed thereon, then the protective film 258 is formed through the processing of the present embodiment as described above for the flattening film 253, and then the microlenses 259 are formed, whereby the CCD sensor 200 is manufactured.

As described above, according to the method of processing a substrate of the present embodiment, a wafer W on which has been formed an insulating film 261 made of $SiO_2$ having a predetermined thickness for forming a flattening film 253 having a desired thickness is exposed to an atmosphere of a mixed gas comprised of ammonia gas, hydrogen fluoride gas and argon gas under a predetermined pressure, and then the wafer W that has been exposed to the atmosphere of the mixed gas is heated to a predetermined temperature. As a result, a product having a complex structure is produced from the $SiO_2$ constituting the insulating film 261, the ammonia gas and the hydrogen fluoride gas, whereby a product layer 262 having a desired thickness is produced. The complex structure of the produced product is then thermally decomposed, the product being separated into silicon tetrafluoride ($SiF_4$), ammonia and hydrogen fluoride, which are vaporized. Through the product being vaporized, the product layer 262, which is an upper layer of the insulating film 261, is removed, whereby the flattening film 253 can be formed to the desired thickness.

At this time, the amount produced of the product, i.e. the thickness of the product layer 262, can be controlled through parameters of the mixed gas of ammonia gas and hydrogen fluoride gas such as the pressure of the mixed gas and the volumetric flow rate ratio of the hydrogen fluoride gas to the ammonia gas, and parameters such as the pressure in the chamber 38 and the heating temperature of the wafer W mounted on the stage heater 51. The thickness of the product layer 262 produced can thus be controlled precisely by controlling the parameters of the mixed gas and so on, whereby the amount removed of the insulating film 261 can be controlled precisely. As a result, through such isotropic etching, the flattening film 253 can be formed precisely to the desired thickness, and hence the flattening film 253 can be made thin. The light collecting ability of the CCD sensor 200 can thus be improved, and hence the sensitivity of the photoelectric transducers 210 can be improved, and moreover alignment of the upper layer elements to the base elements can be carried out precisely in the manufacture of the CCD sensor 200.

Moreover, the amount produced of the product levels off after a certain time has elapsed, and hence the insulating film 261 is not completely removed through the processing of the present invention. A decrease in wiring reliability in the CCD sensor 200 manufactured from the wafer W can thus be prevented.

Moreover, according to the method of processing a substrate of the present embodiment, the upper layer of the insulating film 261 is removed by subjecting the wafer W to plasma-less etching. As a result, charge is not accumulated on a gate electrode in the CCD sensor 200 manufactured from the wafer W, and hence degradation or destruction of a gate oxide film can be prevented. Moreover, the CCD sensor 200 is not irradiated with energetic particles, and hence crystal defects can be prevented from occurring in the CCD sensor 200. Furthermore, unanticipated chemical reactions caused by plasma do not occur, and hence generation of impurities can be prevented, whereby contamination of the chamber 38 and the chamber 50 can be prevented.

Furthermore, according to the method of processing a substrate of the present embodiment, the upper layer of the insulating film 261 is removed by subjecting the wafer W to dry cleaning. As a result, changes in properties of the surface of the wafer W can be suppressed, and hence a decrease in wiring reliability in the CCD sensor 200 manufactured from the wafer W can be reliably prevented.

Consequently, according to the method of processing a substrate of the present embodiment, the amount removed of an insulating film (the insulating film 261) can be controlled precisely, and thus the insulating film can be made thin, without damaging an electronic device (the CCD sensor 200).

The method of processing a substrate of the present invention is not limited to being applied when forming to a desired thickness a flattening film on which color filters are to be formed in a CCD sensor or a protective film for the color filters as described above, but rather can also be applied when precisely forming to a desired film thickness an $SiO_2$ insulating film in another electronic device. For example, the method of processing a substrate of the present invention can be used for making an insulating film formed directly on a wafer W or an interlayer insulating film thin.

Moreover, the method of processing a substrate according to the present invention is not limited to being used in the manufacture of a CCD sensor as described above, but rather may be used in the manufacture of another electronic device, for example a CCD thin film device having an optically transparent insulating thin film at least on a surface thereof.

Furthermore, the CCD sensor is not limited to being the CCD sensor 200 described above, but rather may be constructed differently. For example, instead of the silicon nitride film 252, the CCD sensor may have a light-transmitting electrode comprised of a thin amorphous film formed by CVD.

The present invention is not limited to the embodiment described above. For example, other embodiments include a method of manufacturing an electronic device, a method of manufacturing a solid-state imaging device, or a method of manufacturing a CCD thin film device, including the method of processing a substrate described above.

Figure 8:
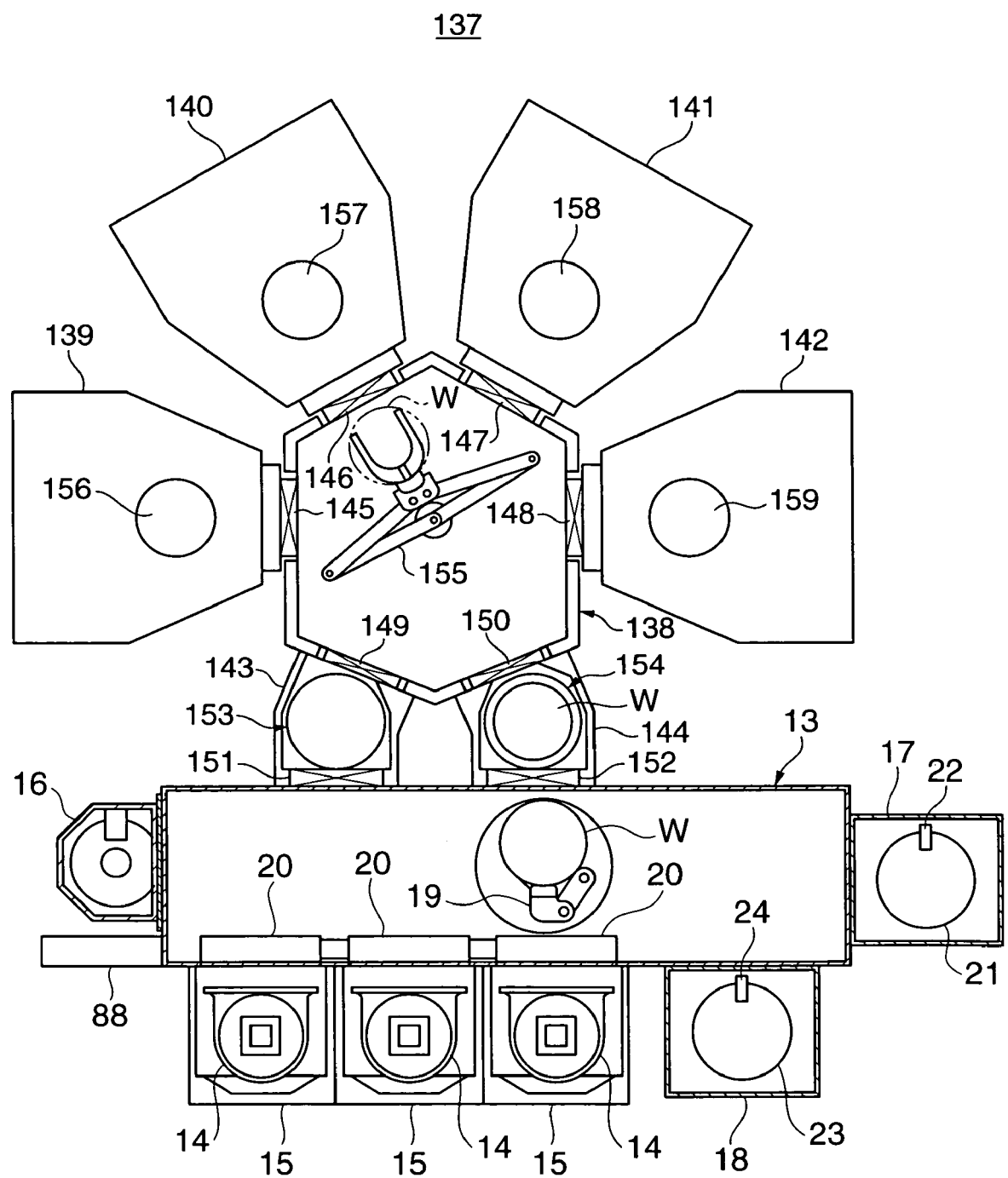
FIG. 8 is a plan view schematically showing the construction of a first variation of the substrate processing apparatus to which is applied the method of processing a substrate according to the above embodiment.

FIG. 8 is a plan view schematically showing the construction of a first variation of the substrate processing apparatus to which is applied the method of processing a substrate according to the above embodiment. In FIG. 8, component elements the same as ones of the substrate processing apparatus 10 shown in FIG. 1 are designated by the same reference numerals as in FIG. 1, and description thereof is omitted here.

As shown in FIG. 8, the substrate processing apparatus 137 is comprised of a transfer unit 138 having a hexagonal shape in plan view, four processing units 139 to 142 arranged in a radial manner around the transfer unit 138, a loader unit 13, and two load lock units 143 and 144 that are each disposed between the transfer unit 138 and the loader unit 13 so as to link the transfer unit 138 and the loader unit 13 together.

The internal pressure of the transfer unit 138 and each of the processing units 139 to 142 is held at vacuum. The transfer unit 138 is connected to the processing units 139 to 142 by vacuum gate valves 145 to 148 respectively.

In the substrate processing apparatus 137, the internal pressure of the loader unit 13 is held at atmospheric pressure, whereas the internal pressure of the transfer unit 138 is held at vacuum. The load lock units 143 and 144 are thus provided respectively with a vacuum gate valve 149 or 150 in a connecting part between that load lock unit and the transfer unit 138, and an atmospheric door valve 151 or 152 in a connecting part between that load lock unit and the loader unit 13, whereby the load lock units 143 and 144 are each constructed as a preliminary vacuum transfer chamber whose internal pressure can be adjusted. Moreover, the load lock units 143 and 144 have respectively therein a wafer mounting stage 153 or 154 for temporarily mounting a wafer W being transferred between the loader unit 13 and the transfer unit 138.

The transfer unit 138 has disposed therein a frog leg-type transfer arm 155 that can bend/elongate and turn. The transfer arm 155 transfers the wafers W between the processing units 139 to 142 and the load lock units 143 and 144.

The processing units 139 to 142 have respectively therein mounting stages 156 to 159 on each of which is mounted a wafer W to be processed. Here, the processing unit 140 is constructed like the first processing unit 25 in the substrate processing apparatus 10, the processing unit 141 is constructed like the second processing unit 34 in the substrate processing apparatus 10, and the processing unit 142 is constructed like the third processing unit 36 in the substrate processing apparatus 10. Each of the wafers W can thus be subjected to the RIE processing in the processing unit 140, the COR processing in the processing unit 141, and the PHT processing in the processing unit 142.

In the substrate processing apparatus 137, as for the substrate processing apparatus 10, the method of processing a substrate according to the above embodiment is implemented by transferring a wafer W on which has been formed an insulating film 261 made of $SiO_2$ having a predetermined thickness for forming a flattening film 253 or protective film 258 having a desired thickness (see FIG. 7A) into the processing unit 141 and carrying out the COR processing, and then transferring the wafer W into the processing unit 142 and carrying out the PHT processing.

Operation of the component elements in the substrate processing apparatus 137 is controlled using a system controller constructed like the system controller in the substrate processing apparatus 10.

Figure 9:
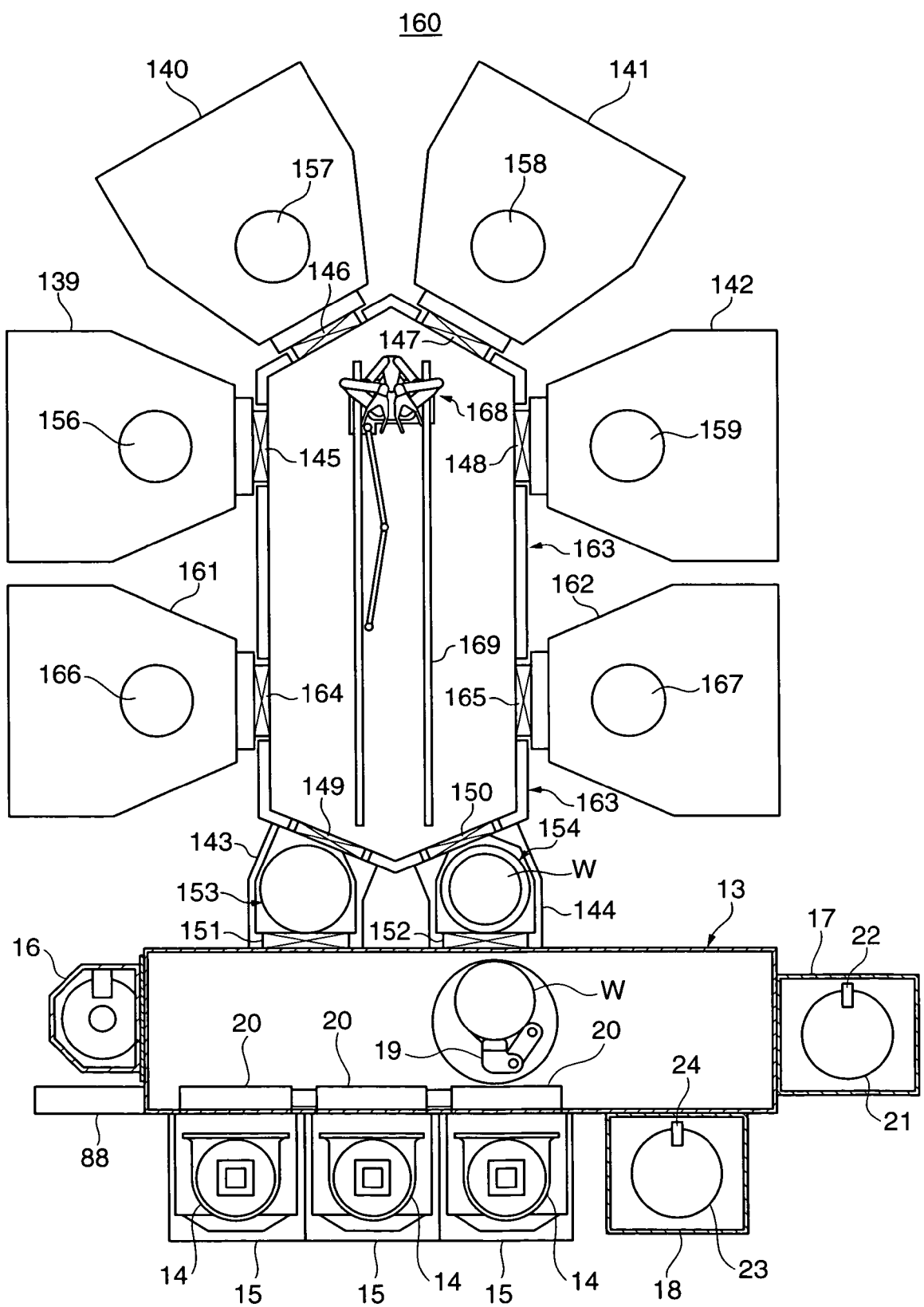
FIG. 9 is a plan view schematically showing the construction of a second variation of the substrate processing apparatus to which is applied the method of processing a substrate according to the above embodiment.

FIG. 9 is a plan view schematically showing the construction of a second variation of the substrate processing apparatus to which is applied the method of processing a substrate according to the above embodiment. In FIG. 9, component elements the same as ones of the substrate processing apparatus 10 shown in FIG. 1 or the substrate processing apparatus 137 shown in FIG. 8 are designated by the same reference numerals as in FIG. 1 or FIG. 8, and description thereof is omitted here.

As shown in FIG. 9, compared with the substrate processing apparatus 137 shown in FIG. 8, the substrate processing apparatus 160 has an additional two processing units 161 and 162, and the shape of a transfer unit 163 of the substrate processing apparatus 160 is accordingly different to the shape of the transfer unit 138 of the substrate processing apparatus 137. The additional two processing units 161 and 162 are respectively connected to the transfer unit 163 via a vacuum gate valve 164 or 165, and respectively have therein a wafer W mounting stage 166 or 167.

Moreover, the transfer unit 163 has therein a transfer arm unit 168 comprised of two SCARA-type transfer arms. The transfer arm unit 168 moves along guide rails 169 provided in the transfer unit 163, and transfers the wafers W between the processing units 139 to 142, 161 and 162, and the load lock units 143 and 144.

In the substrate processing apparatus 160, as for the substrate processing apparatus 137, the method of processing a substrate according to the above embodiment is implemented by transferring a wafer W on which has been formed an insulating film 261 made of $SiO_2$ having a predetermined thickness for forming a flattening film 253 or protective film 258 having a desired thickness (see FIG. 7A) into the processing unit 141 and carrying out the COR processing, and then transferring the wafer W into the processing unit 142 and carrying out the PHT processing.

Operation of the component elements in the substrate processing apparatus 160 is again controlled using a system controller constructed like the system controller in the substrate processing apparatus 10.

Examples of the above electronic device include semiconductor devices, and also non-volatile or high-capacity memory devices having therein a thin film made of an insulating metal oxide material such as a ferroelectric material or a high dielectric material, in particular a material having a perovskite crystal structure. Examples of materials having a perovskite crystal structure include lead zirconate titanate (PZT), barium strontium titanate (BST), and strontium bismuth niobium tantalate (SBNT).

It is to be understood that the object of the present invention can also be attained by supplying to a system or apparatus (the EC 89) a storage medium in which a program code of software that realizes the functions of the above described embodiment is stored, and then causing a computer (or CPU, MPU, or the like) of the system or apparatus (EC 89) to read out and execute the program code stored in the storage medium.

In this case, the program code itself read out from the storage medium realizes the functions of the embodiment described above, and hence the program code and the storage medium in which the program code is stored constitute the present invention.

The storage medium for supplying the program code may be, for example, a floppy (registered trademark) disk, a hard disk, a magnetic-optical disk, a CD-ROM, a CD-R, a CD-RW, a DVD-ROM, a DVD-RAM, a DVD-RW, a DVD+RW, a magnetic tape, a non-volatile memory card, and a ROM. Alternatively, the program code may be downloaded via a network.

Moreover, it is to be understood that the functions of the above described embodiment may be accomplished not only by executing a program code read out by a computer, but also by causing an OS (operating system) or the like which operates on the computer to perform a part or all of the actual operations based on instructions of the program code.

Furthermore, it is to be understood that the functions of the above described embodiment may be accomplished by writing a program code read out from the storage medium into a memory provided on an expansion board inserted into a computer or in an expansion unit connected to the computer or in an expansion unit connected to the computer and then causing a CPU or the like provided on the expansion board or in the expansion unit to perform a part or all of the actual operations based on instructions of the program code.

The form of the program code may be, for example, object code, program code executed by an interpreter, or script data supplied to an OS.

What is claimed is:

1. A method of manufacturing a solid-state imaging device, the method comprising:

an insulating film exposure step of exposing an insulating film on a substrate of the solid-state imaging device to an atmosphere of a mixed gas containing ammonia and hydrogen fluoride under a predetermined pressure; and an insulating film heating step of heating to a predetermined temperature the insulating film that has been exposed to the atmosphere of the mixed gas, wherein in said insulating film heating step, in order to produce viscous flow around the substrate, a nitrogen gas is supplied such that a gas flow rate of the supplied nitrogen gas around the substrate is in a range of 500 to 3000 SCCM and a pressure around the substrate is set to a range of 6.7×10 to 1.3×10² Pa, and wherein molecules vaporized from a product which is produced in said insulating film exposure step are discharged by using the produced viscous flow.

2. A method as claimed in claim 1, wherein in said insulating film exposure step, the substrate is subjected to plasma-less etching.

3. A method as claimed in claim 1, wherein in said insulating film exposure step, the substrate is subjected to dry cleaning.

4. A method as claimed in claim 1, further comprising a product production condition deciding step of measuring a shape of the insulating film, and deciding at least one of a volumetric flow rate ratio of the hydrogen fluoride to the ammonia in the mixed gas and the predetermined pressure in accordance with the measured shape.

5. A method as claimed in claim 1, wherein a volumetric flow rate ratio of the hydrogen fluoride to the ammonia in the mixed gas is in a range of 1 to ½, and the predetermined pressure is in a range of $6.7 \times 10^{-2}$ to 4.0 Pa.

6. A method as claimed in claim 1, wherein the predetermined temperature is in a range of 80 to 200° C.

7. A method of manufacturing a solid-state imaging device, the method comprising:

a film thickness deciding step of deciding a desired film thickness of an insulating film on a substrate of the solid-state imaging device;

a pre-processing shape measuring step of measuring a shape of the insulating film;

a processing condition deciding step of deciding a first processing condition and a second processing condition based on a comparison of the measured shape and the decided film thickness;

an insulating film exposure step of exposing the insulating film to an atmosphere of a mixed gas containing ammonia and hydrogen fluoride under a predetermined pressure based on the first processing condition; and an insulating film heating step of heating to a predetermined temperature based on the second processing condition the insulating film that has been exposed to the atmosphere of the mixed gas, wherein in said insulating film heating step, in order to produce viscous flow around the substrate, a nitrogen gas is supplied such that a gas flow rate of the supplied nitrogen gas around the substrate is in a range of 500 to 3000 SCCM and a pressure around the substrate is set to a range of 6.7×10 to 1.3×10² Pa, and wherein molecules vaporized from a product which is produced in said insulating film exposure step are discharged by using the produced viscous flow.

8. A method as claimed in claim 7, further comprising:

a post-processing shape measuring step of measuring a shape of the insulating film after said insulating film heating step; and a processing condition changing step of changing the first processing condition and the second processing condition based on a comparison of the shape measured in said post-processing shape measuring step and the decided film thickness.

9. A method as claimed in claim 7, wherein the first processing condition comprises at least one of a volumetric flow rate ratio of the hydrogen fluoride to the ammonia in the mixed gas, and the predetermined pressure, and the second processing condition comprises the predetermined temperature.

10. A method of manufacturing a solid-state imaging device having a substrate, a plurality of photoelectric transducers provided in a matrix shape on the substrate, an insulating film formed on the substrate having the plurality of photoelectric transducers provided thereon, signal charge transfer electrodes constructed from switching elements and wiring that are formed adjacent to the photoelectric transducers, interlayer insulating films each formed on a corresponding one of the signal charge transfer electrodes, and light-shielding films made of a metal each formed on a corresponding one of the signal charge transfer electrodes via a corresponding one of the interlayer insulating films, the method comprising:

a metallic film formation step of forming a metallic film for forming the light-shielding films;

a resist patterning step of forming a resist in a predetermined pattern for forming the light-shielding films from the metallic film;

a patterning step of patterning by dry etching the metallic film, and the insulating film as far as close to immediately above the photoelectric transducers using the resist, thus forming the light-shielding films and holes;

a resist removal step of removing the resist;

a silicon nitride film formation step of forming a silicon nitride film in recesses defined by the light-shielding films and the holes;

a flattening film formation step of coating on a transparent insulating material having a lower refractive index than the silicon nitride film so as to form a first insulating layer, and flattening the first insulating layer so as to form a flattening film;

a color filter formation step of forming color filters on the flattening film; and a protective film formation step of forming a second insulating layer on the color filters, and thinning the second insulating layer so as to form a protective film;

wherein said flattening film formation step has an insulating film exposure step of exposing the first insulating layer to an atmosphere of a mixed gas containing ammonia and hydrogen fluoride under a predetermined pressure, and an insulating film heating step of heating to a predetermined temperature the first insulating layer that has been exposed to the atmosphere of the mixed gas;

and said protective film formation step has an insulating film exposure step of exposing the second insulating layer to an atmosphere of a mixed gas containing ammonia and hydrogen fluoride under a predetermined pressure, and an insulating film heating step of heating to a predetermined temperature the second insulating layer that has been exposed to the atmosphere of the mixed gas.

11. A method of manufacturing a solid-state imaging device, the method comprising:

a light-receiving portion formation step of forming on a substrate a plurality of light-receiving portions that produce signal charges in response to received light;

an insulating film formation step of forming an insulating film on the substrate on which the light-receiving portions have been formed;

a signal charge transfer portion formation step of forming signal charge transfer portions that transfer signal charges obtained by the light-receiving portions;

a light-shielding film formation step of forming conductive light-shielding films on the signal charge transfer portions; and a light-transmitting electrode formation step of forming a light-transmitting electrode comprising an amorphous silicon thin film by chemical vapor deposition on the light-receiving portions via the insulating film, and directly on the light-shielding films;

wherein said insulating film formation step has an insulating material coating step of coating an insulating material onto the substrate on which the light-receiving portions have been formed, for forming the insulating film, an insulating material exposure step of exposing the coated on insulating material to an atmosphere of a mixed gas containing ammonia and hydrogen fluoride under a predetermined pressure, and an insulating material heating step of heating to a predetermined temperature the insulating material that has been exposed to the atmosphere of the mixed gas.

12. A method of manufacturing a CCD thin film device having a substrate, a plurality of chips having an identically shaped pattern formed on the substrate, and an optically transparent insulating thin film at least on a surface, the method comprising:

a film formation step of forming an insulating film for forming the thin film;

a film exposure step of exposing the insulating film to an atmosphere of a mixed gas containing ammonia and hydrogen fluoride under a predetermined pressure;

a film heating step of heating to a predetermined temperature the insulating film that has been exposed to the atmosphere of the mixed gas;

a film detection step of carrying out detection relating to a predetermined condition on the insulating film after the heating at a preset detection location on each of the chips; and a transfer step of transferring the thin film device to a subsequent manufacturing step once the insulating film satisfies the predetermined condition at all of the detection locations on the chips in said film detection step.

* * * * *